(12) United States Patent
Fujisawa et al.

(10) Patent No.: US 8,238,072 B2
(45) Date of Patent: Aug. 7, 2012

(54) BIPOLAR ELECTROSTATIC CHUCK

(75) Inventors: Hiroshi Fujisawa, Nara (JP); Kinya Miyashita, Tokyo (JP)

(73) Assignee: Creative Technology Corporation, Tokyo (JP)

( * ) Notice: Subject to any disclaimer, the term of this patent is extended or adjusted under 35 U.S.C. 154(b) by 0 days.

(21) Appl. No.: 12/691,613

(22) Filed: Jan. 21, 2010

(65) Prior Publication Data

US 2010/0149720 A1  Jun. 17, 2010

Related U.S. Application Data

(62) Division of application No. 10/591,945, filed as application No. PCT/JP2005/004557 on Mar. 15, 2005, now abandoned.

(30) Foreign Application Priority Data

Mar. 19, 2004 (JP) ................................ 2004-081432
Jun. 29, 2004 (JP) ................................ 2004-191280

(51) Int. Cl.
*H01L 21/683* (2006.01)
(52) U.S. Cl. ........................................ 361/234
(58) Field of Classification Search ............... 361/234
See application file for complete search history.

(56) References Cited

U.S. PATENT DOCUMENTS

| | | | | |
|---|---|---|---|---|
| 4,652,318 A | * | 3/1987 | Masuda et al. ............ | 156/89.19 |
| 5,103,367 A | * | 4/1992 | Horwitz et al. ............ | 361/234 |
| 5,646,814 A | * | 7/1997 | Shamouilian et al. ...... | 361/234 |
| 5,838,529 A | | 11/1998 | Shufflebotham et al. | |
| 6,104,596 A | * | 8/2000 | Hausmann .................. | 361/234 |
| 6,273,958 B2 | * | 8/2001 | Shamouilian et al. ...... | 118/728 |

(Continued)

FOREIGN PATENT DOCUMENTS

CN    158160 A    2/2005

(Continued)

OTHER PUBLICATIONS

Asano et al., Fundamental Study of an Electrostatic Chuck for Silicon Wafer Handling; Conference Record of the 1997 IEEE Industry Applications Conference, vol. 3, pp. 1998-2003 (1998).
English language abstract of JP 11-251417 (Sep. 17, 1999).
English language abstract of JP 2002-026113 (Jan. 25, 2002).
English language abstract of JP 2002-124446 (Apr. 26, 2002).
English language abstract of JP 2003-179128 (Jun. 27, 2003).
English language abstract of JP 2003-318251 (Nov. 7, 2003).
English language abstract of JP 2004-031594 (Jan. 29, 2004).

(Continued)

*Primary Examiner* — Jared Fureman
*Assistant Examiner* — Nicholas Ieva
(74) *Attorney, Agent, or Firm* — Birch, Stewart, Kolasch & Birch, LLP

(57) ABSTRACT

A bipolar electrostatic chuck which has excellent dielectric breakdown strength and provides excellent attracting performance. The bipolar electrostatic chuck eliminates difficulty in dismounting a sample from a sample attracting plane as much as possible after application of a voltage to electrodes is finished. The bipolar electrostatic chuck is provided with a first electrode and a second electrode in an insulator and permits a surface of the insulator to be the sample attracting plane. The insulator has the first electrode, an interelectrode insulating layer and the second electrode in this order from the sample attracting plane in the depth direction. The second electrode has a region not overlapping with the first electrode in a normal line direction of the sample attracting plane.

10 Claims, 24 Drawing Sheets

U.S. PATENT DOCUMENTS

| | | | |
|---|---|---|---|
| 6,431,112 B1 * | 8/2002 | Sill et al. | 118/723 E |
| 6,500,686 B2 * | 12/2002 | Katata et al. | 438/22 |
| 6,563,076 B1 * | 5/2003 | Benjamin et al. | 219/121.54 |
| 6,768,627 B1 * | 7/2004 | Kitabayashi et al. | 361/234 |
| 7,881,036 B2 * | 2/2011 | Fujisawa et al. | 361/234 |
| 2001/0046112 A1 * | 11/2001 | Herchen | 361/234 |
| 2002/0006680 A1 | 1/2002 | Katala et al. | |
| 2002/0043530 A1 | 4/2002 | Ito | |
| 2002/0109955 A1 * | 8/2002 | Masuda et al. | 361/234 |
| 2003/0015521 A1 * | 1/2003 | Ito | 219/544 |

FOREIGN PATENT DOCUMENTS

| | | | |
|---|---|---|---|
| JP | 9-293775 | | 11/1997 |
| JP | 2838810 B | | 10/1998 |
| JP | 2000-502509 A | | 2/2000 |
| JP | 2001-164202 | * | 12/2002 |
| JP | 2002-038291 | * | 8/2003 |
| JP | 2003-249544 | * | 9/2003 |
| JP | 2004-31594 | | 1/2004 |
| WO | WO 97/23945 | * | 7/1997 |
| WO | WO 97/23945 A1 | | 7/1997 |

OTHER PUBLICATIONS

English language abstract of JP 2004-031599 (Jan. 29, 2004).
English language abstract of JP 6-302678 (Oct. 28, 1994).
English language abstract of JP 8-064663 (Mar. 8, 1996).
English language abstract of JP 8-203991 (Aug. 9, 1996).
English translation of International Preliminary Report on Patentability (Form PCT/IPEA/338 and 409) issued on Jan. 18, 2007 in PCT/JP2005/004557.
Partial English language translation of JP 10-223742 (Aug. 21, 1998).

* cited by examiner

BIPOLAR ELECTROSTATIC CHUCK

This application is a Divisional of application Ser. No. 10/591,945 filed on Sep. 8, 2006 now abandoned and for which priority is claimed under 35 U.S.C. §120. Application Ser. No. 10/591,945 is the national phase of PCT International Application No. PCT/JP2005/004557 filed on Mar. 15, 2005 under 35 U.S.C. §371, and also claims priority under 35 U.S.C. §119(a) on Patent Application Nos. 2004-081432 and 2004-191280 filed in Japan on Mar. 19, 2004 and Jun. 29, 2004, respectively. The entire contents of each of the above-identified applications are hereby incorporated by reference.

TECHNICAL FIELD

The present invention relates to a bipolar electrostatic chuck that electro-statically attracts and holds a sample.

BACKGROUND ART

There has been widely employed an electrostatic chuck that electro-statically attracts and holds a sample such as a wafer or a glass in a device that is used in a semiconductor manufacturing process required in forming an integrated circuit on a semiconductor wafer such as silicon, such as an etching device, a plasma processing device used for formation of a thin film through a chemical vapor deposition (abbreviated to CVD), an electron exposure device, an ion rendering device, an ion implanting device, or in a device that is used in a process of manufacturing a liquid crystal display panel which is employed for a TV screen or a computer display such as a substrate bonding device or an ion doping device which is used in press-inserting liquid crystal in an insulating substrate such as a glass. This is because the electrostatic chuck exercises an excellent performance with respect to a problem of a damage of a sample, a problem of a high defect rate that is attributable to particles which are generated from a scratch caused by a mechanical contact, the compensation of the flatness of the held sample, and the like as compared with holding using a mechanical mechanism.

In recent years, large size liquid crystal display televisions have been widely used, and flat panel displays have been developed. In response, there is the necessity of processing larger glass substrates than the past glass substrates. As an example, products using large substrates that exceed 1 m×1 m in size have been manufactured. Also, in a semiconductor manufacturing process, processing of a silicon wafer that is 300 mm in diameter is becoming a present mainstream. In both cases, the size of products is becoming larger, and an increase in the weight of the glass substrate and the semiconductor wafer makes more important the high attracting performance as well as the flatness of the sample on an attracting plane when the sample is attracted by the electrostatic chuck.

In general, the flatness of the sample that has been attracted by the electrostatic chuck on the attracting plane is associated with the magnitude of a holding force by which the electrostatic chuck holds the sample. In other words, as the sample to be attracted is increasing in size as described above, the electrostatic chuck must have the sufficient holding force.

In the bipolar electrostatic chuck that applies positive and negative voltages to two electrodes, it is presumed that a semiconductor wafer such as silicon or dielectric material such as a glass substrate is attracted by the action of a gradient force F that is developed in the case of an uneven electric field as expressed by the following Formula (1). The gradient force is proportional to the spatial differential of the electric field intensity E squared, that is, the gradient.

$$F \propto \nabla(E^2) \tag{1}$$

Up to now, there have been reported several bipolar electrostatic chucks that allows a distance between the adjacent electrodes to be narrowed. For example, there has been reported a bipolar electrostatic chuck in which electrodes each having a band-like comb teeth configuration are alternately arranged to form a one-layer comb type bipolar electrode of 10 cm×10 cm, and the respective electrodes are arranged at a pitch of 1 mm (each of the electrode widths is 1 mm and the interval between the respective electrodes is 1 mm), and a surface dielectric layer is set to 50 μm (see K. Asano, F. Hatakeyama, and K. Yatsuzuka, "Fundamental Study of an Electrostatic Chuck for Silicon Wafer Handling", IAS '97. Conference Record of the 1997 IEEE Industry Applications Conference Thirty-Second IAS Annual Meeting (Cat. No. 97CH36096), Part: vol. 3, Pages: 1998-2003). The electrostatic chuck obtains an attracting performance of equal to or less than 3N at a supply voltage of 1500 V with respect to a silicon wafer to be attracted. This corresponds to equal to or less than 3 fg/cm$^2$ in the terms of an attracting performance per unit area. Also, there has been reported an example in which the line width of the band-like electrodes and the interval of the band-like electrodes are set to 0.3 to 3 mm, respectively, in a bipolar electrostatic chuck having a pair of band-like electrodes in the interior of an insulating material (see JP 10-223742 A). In addition, there has been reported an example in which electrodes apart from each other are disposed on a dielectric base, and the electrode width and the electrode interval of those electrodes are set to 100 μm or less, respectively (see JP 2000-502509 A).

However, in the case where the distance between the electrodes that are adjacent to each other is shortened, there arises a problem of a discharge limit. That is, because it is difficult to control an etching cross-section of an electrode material that is used for the electrostatic chuck and to control the formation of an adhesive layer that fixes the electrodes in the interior of the insulating material, for example, as expressed in a schematic cross-sectional view (enlarged view) of the vicinity of the electrodes shown in FIG. 28 that illustrates a cross section of the conventional bipolar electrostatic chuck, an electric field is liable to be concentrated to sharp portions of edges of a first electrode 2 and a second electrode 4 which are attributable to uneven etching. Also, voids occur when an adhesive agent for forming an adhesive layer that fixes the respective insulating layers to each other or the insulating layers with the electrodes is bonded. As a result, the dielectric breakdown strength is remarkably deteriorated between the adjacent electrodes. For that reason, in the above-mentioned bipolar electrostatic chuck, when a distance between the electrodes is close to a given distance, there is an uncertainty that a discharge may occur between the electrodes.

In general, it is presumed that the discharge limit is about 3 kV when the distance between the electrodes is 0.5 mm in the bipolar electrostatic chuck. In fact, in the case of using the bipolar electrostatic chuck described above, a voltage that is lower than this discharge limit must be applied from the viewpoint of the safety ratio. For that reason, in the conventional bipolar electrostatic chuck that narrows the interval between the electrodes as described above, a voltage that can be actually applied is limited, and there arises such a problem that a sufficient attracting performance, i.e., gradient force, cannot be exercised because a weight per unit area is increased with respect to a semiconductor wafer that is increasingly enlarged diameter in size or a glass substrate that is used for a liquid crystal TV or a flat panel display which are increasingly enlarged in size.

On the other hand, in the case where an insulating sample is attracted by the electrostatic chuck, there arises such a problem that a sample is difficult to dismount from the attracting plane of the sample due to the residual charges even if a voltage that is applied to the electrodes is turned off. In particular, this problem becomes severe as the sample is increasingly enlarged in size.

The electrodes are positioned in a plane in most of the bipolar electrostatic chucks including the type described above. There has also been reported an electrostatic chuck of the type in which a plurality of electrodes are laminated on one another in the interior of the insulating material (see JP 2838810 B). This bipolar electrostatic chuck is identical with the above-mentioned bipolar electrostatic chuck in the viewpoint that electrodes that are different in the polarity positioned in the same plane, and suffers from the discharge limit likewise.

Patent Document 1: JP 10-223742 A
Patent Document 2: JP 2000-502509 A
Patent Document 3: JP 2838810 B
Non Patent Document 1: K. Asano, F. Hatakeyama, and K. Yatsuzaka, "Fundamental Study of an Electrostatic Chuck for Silicon Wafer Handling", IAS '97. Conference Record of the 1997 IEEE Industry Applications Conference thirty-second IAS Annual Meeting (Cat. No. 97CH36096), Part: vol. 3, Pages: 1998-2003

DISCLOSURE OF THE INVENTION

Problems to be Solved by the Invention

Under the circumstances, the present inventors have paid attention to the fact that the discharge limit of the conventional bipolar electrostatic chuck described above is about 6 MV/m in electric field intensity. This value is lower than the dielectric breakdown field strength of 10 MV/m in vacuum which has been generally empirically known, and is overwhelmingly lower than the dielectric breakdown strength of the insulating material, for example, 160 MV/m in polyimide. This has led to a conclusion that the configuration of the adjacent electrode edges, voids within the adhesive layer which exist between those electrodes greatly, and the like cause the deterioration of the dielectric breakdown field strength between the electrodes that apply voltages different in polarity from each other which are adjacent to each other in the interior of the insulating material.

Then, as a result of keenly studying the realization of the bipolar electrostatic chuck that is excellent in electric field strength and exercises the high gradient force that is sufficiently acceptable to a large sample, the present inventors have completed the present invention by the following manner. A first electrode and a second electrode which apply voltages that are different in polarity from each other are arranged in the order from a sample attracting plane toward a depth direction in the interior of an insulating material, and an insulating layer that is excellent in the dielectric breakdown strength is disposed between those electrodes, to thereby shorten a distance between those electrodes with the result that the excellent dielectric breakdown strength is found even if the high gradient force is exercised.

Accordingly, an object of the present invention is to provide a bipolar electrostatic chuck that is excellent in dielectric breakdown strength and exercises the excellent attracting performance.

Also, another object of the present invention is to provide a bipolar electrostatic chuck which is capable of eliminating the difficulty of dismounting the sample from the sample attracting plane as much as possible after a turning off the voltage that has been applied to the electrodes.

Means for Solving the Problems

That is, the present invention relates to a bipolar electrostatic chuck which has a first electrode and a second electrode in an interior of an insulating material, generates at least an attracting performances by a gradient force, and attracts a sample by allowing a surface of the insulating material to function as a sample attracting plane, characterized in that the insulating material is formed by laminating an upper insulating layer, the first electrode, an interelectrode insulating layer, when the sample attracting plane is viewed in a depth direction, the second electrode has an area that is not overlapped with the first electrode, a plurality of first electrodes and a plurality of second electrodes being alternately arranged in a direction in which the area that is not overlapped is crossed a plurality of times in a depth direction of the insulating material, and the second electrode has an area that is not overlapped with the first electrode when the sample attracting plane is viewed in the depth direction.

Further, the present invention relates to a bipolar electrostatic chuck, in which an electrically conductive layer is further formed on the surface of the insulating material, and the surface of the electrically conductive layer serves as the sample attracting plane.

In the present invention, it is necessary that the first electrode, the interelectrode insulating layer, and the second electrode are disposed in the order of distance from the sample attracting plane in the depth direction in the insulating material, and the second electrode has an area that is not overlapped with respect to the first electrode in a direction normal to the sample attracting plane. It is necessary that the first electrode and the second electrode are apart from each other in the depth direction, i.e., thickness direction, of the insulating material in the interior of the insulating material. Also, it is necessary that the interelectrode insulating layer exists between the first electrode and the second electrode.

In the present invention, the fact that the second electrode has the area that is not overlapped with respect to the first electrode in a direction normal to the sample attracting plane corresponds to the fact that the second electrode has an area that is not overlapped with the first electrode in the case where only the first electrode and the second electrode that exist in the interior of the insulating material are viewed in the sample attracting plane in the vertical direction. To be more specific, there is a case in which the second electrode is not overlapped with respect to the first electrode when the sample attracting plane is viewed in the depth direction. There is also another case in which a part of the second electrode is overlapped with the first electrode when the sample attracting plane is viewed in the depth direction. In this case, the second electrode is not overlapped with the first electrode except for the above-mentioned overlapped portion. In this event, a case in which the first electrode and the second electrode are overlapped in a line when the sample attracting plane is viewed in the depth direction, and a case in which the first electrode and the second electrode are overlapped in a point contact in the normal direction of the sample attracting plane belong to the latter specific example, that is, the case in which a part of the second electrode is overlapped with the first electrode when the sample attracting plane is viewed in the depth direction.

In the respective configurations of the first electrode and the second electrode and in the arrangement of both electrodes in the interior of the insulating material in the present invention, it is necessary that the second electrode has the area that is not overlapped with respect to the first electrode when the sample attracting plane is viewed in the depth direction, as described above. The following cases are provided as examples.

That is, the case in which the second electrode is not overlapped with the first electrode includes, for example, a case in which the first electrode is formed in the band-like comb teeth configuration, the second electrode is also formed in the band-like comb teeth configuration, and those two band-like comb teeth are alternately arranged in such a manner that the second electrode is not overlapped with the first electrode. Also, there is included a case in which the first electrode is formed in the semicircular configuration, the second electrode is formed in the semicircular configuration so as to be axisymmetrical with the first electrode, and the second electrode is not overlapped with the first electrode. Further, there is included a case in which the first electrode is formed in a rectangular or square configuration, and the second electrode is formed in a rectangular or square configuration so as to be axisymmetrical with the first electrode in such a manner that the second electrode is not overlapped with the first electrode.

The case in which a part of the second electrode is overlapped with the first electrode includes, for example, a case in which the first electrode is formed in the band-like comb teeth configuration, the second electrode is also formed in the plane configuration having a given area, and the part of the second electrode is overlapped with the first electrode. Also, there is included a case in which the first electrode is formed in a curb configuration, the second electrode is formed in the plane configuration having a given area, and a part of the second electrode is overlapped with the first electrode.

Also, there is included a case in which the first electrode is formed in the mesh configuration having a plurality of openings which are shaped in a circle, a triangle, a square, a rectangle, or a polygon more than a quadrangle in number of corners within a given area, the second electrode is formed in the plane configuration having a given area, and a part of the second electrode is overlapped with the first electrode. It is preferable that the size of the openings in the first electrode, corresponding to the length of a diameter of a circle and the length of a diagonal line of a quadrangle or a polygon, be set to be substantially equal to a distance to the adjacent opening, or about 120% of the distance between the adjacent openings. The first electrode is formed in the mesh configuration having the openings of the above-mentioned size, thereby making it possible to appropriately increase the contribution of an electric field from the second electrode. It is preferable that the specific size of each of the openings be 0.1 to 3.0 mm from the viewpoint of exercising the sufficient gradient force. In addition, it is preferable that the openings uniformly exist within the given area of the first electrode.

Further, there is included a case in which the first electrode is formed in a ring configuration having a given width, the second electrode is formed in a plane configuration having a given circular area, and a part of the second electrode is overlapped with the first electrode. Still further, there is included a case in which the first electrode centers on a circular portion having a given circular area, has a first annular portion that is concentrically disposed at a given interval from the circular portion, and has a first connection portion that connects the circular portion and the first annular portion, and the second electrode is formed in an annular configuration having a width smaller than an interval between the circular portion and the first annular portion of the first electrode, and is disposed between the circular portion and the first annular portion of the first electrode when viewed in the depth direction of the sample attracting plane. Yet further, there is included a case in which the first electrode centers on a circular portion having a given circular area, has a first annular portion that is concentrically disposed at a given interval from the circular portion, and has a first connection portion that connects the circular portion and the first annular portion, and the second electrode is formed in an annular configuration having a width same as an interval between the circular portion and the first annular portion of the first electrode, and is disposed between the circular portion and the first annular portion of the first electrode when viewed in the depth direction of the sample attracting plane. As described above, in the case where the first electrode has the circular portion, there is included a case in which the first annular portion, and the first connection portion, and the second electrode is annularly formed, it is possible that each of the first electrode and the second electrode has a plurality of concentric annular portions. Furthermore, the first electrode has two or more first annular portions that are concentrically arranged at a given interval, the second electrode has two or more second annular portions that are concentrically arranged at a given interval and the second connection portion connects between the second annular portions, and the respective second annular portions of the second electrode are disposed between the respective first annular portions of the first electrode when viewed in the depth direction of the sample attracting plane.

In addition, it is possible that the first electrode and the second electrode are formed in any configurations described above, respectively, and the first electrode and the second electrode are combined together, and a part of the second electrode is overlapped with the first electrode when viewed in the depth direction of the sample attracting plane.

In the first electrode and the second electrode according to the present invention, for example, voltages that are different in polarity from each other are applied to those electrodes, or one electrode is grounded, and the remaining electrode is set to a positive electrode or a negative electrode, thereby developing a potential difference. The first electrode may be formed of one or more electrodes, and the second electrode may be also formed of one or more electrodes.

In the present invention, it is preferable that both of areas that are occupied by the respective outer peripheral configurations of the first electrode and the second electrode occupy an area that extends from the center portion of the sample attracting plane to the peripheral portion from the viewpoint of the uniformity of the attracting performance exerted on the sample which is held on the sample attracting plane. In other words, it is preferable that the outer peripheral configuration of the first electrode and the outer peripheral configuration of the second electrode be substantially overlapped with each other when the sample attracting plane is viewed in the depth direction. It is more preferable that the outer peripheral configuration of the first electrode, the outer peripheral configuration of the second electrode, and the outer peripheral configuration of the sample that is held on the sample attracting plane be substantially overlapped with each other when the sample attracting plane is viewed in the depth direction.

Also, it is preferable that the area of the second electrode which is not overlapped with the first electrode when the sample attracting plane is viewed in the depth direction uniformly exist in an area that extends from the center portion of the sample attracting plane to the peripheral portion. It is more preferable that an area in which the area that is not overlapped exist uniformly in an area that is occupied by the sample that is attracted by the sample attracting plane.

On the other hand, it is preferable that an area in which the first electrode and the second electrode is overlapped with each other when the sample attracting plane is viewed in the depth direction be reduced from the viewpoint of being capable of reducing the capacitance of the electrostatic chuck. It is more preferable that the second electrode should not be overlapped with the first electrode when the sample attracting plane is viewed in the depth direction. When the capacitance of the electrostatic chuck can be reduced, it is possible to eliminate the difficulty of dismounting the sample from the sample attracting plane after a voltage has been applied to both of those electrodes as much as possible.

In the present invention, it is preferable that a distance between the first electrode and the second electrode in the interior of the insulating material be 1 to 1000 μm, more preferably 50 to 500 μm. When the distance between the first electrode and the second electrode is smaller than 1 μm, for example, in the case where the first electrode, the interelectrode insulating layer, and the second electrode are formed of a laminated body that is commercially available, respectively, that is, in the case where a laminated body having a metal foil is used for both of front and back surfaces of the insulating film, it is difficult to commercially acquire an insulating film that is thinner than 1 μm by which the interelectrode insulating layer is formed. On the contrary, when the interelectrode distance is larger than 1000 μm, there is a possibility that the obtained bipolar electrostatic chuck suffers from a problem in the viewpoint of the thermal conductivity. When the interelectrode distance is equal to or more than 50 μm, an insulating sheet made of polyimide or the like that is commercially available is laminated by means of an adhesive agent to form the interelectrode insulating layer, thereby making it possible to readily form the necessary interelectrode distance. In addition, when the interelectrode distance is equal to or less than 500 μm, the thickness of a single insulating sheet that is commercially available is set to be thicker to form the interelectrode insulating layer, thereby making it possible to readily form the necessary interelectrode distance. Also, the obtained electrostatic chuck is capable of exercising the necessary attracting performance by the low voltage operation of about several kilovolts. It should be noted that the interelectrode distance means the straight shortest distance between the first electrode and the second electrode.

Also in the present invention, in the case where the first electrode is formed in the band-like comb teeth configuration, when the width of the band-like portion of the band-like comb teeth (hereinafter refer to also as "band-like electrode width") is set to be equal to the interval between the adjacent band-like portions (hereinafter referred to also as "interelectrode gap"), assuming that band-like electrode width=interelectrode gap=z, it is preferable that z be in a range of 0.15 to 0.5 mm, and more preferably 0.2 to 0.4 mm. The band-like electrode width and the interelectrode gap are made equal to each other and set in the above range, thereby making it possible to exercise the excellent attracting performance.

The first electrode and the second electrode according to the present invention can be made of, for example, copper, tungsten, aluminum, nickel, chrome, silver, platinum, tin, molybdenum, magnesium, or palladium. It is preferable that the first electrode and the second electrode be made of copper or aluminum from the viewpoint of the electric conductivity or the productivity. Also, the first electrode and the second electrode may be made of the same material or may be made of materials different from each other.

Then, it is possible that the first electrode and the second electrode are formed of a laminated body having a metal foil on both of the front and rear surfaces of the insulating film which is commercially available. Alternatively, it is possible that an electrode surface made of the above-mentioned metal is formed on the upper surface or the lower surface of the interelectrode insulating layer, or on the respective one surfaces of an upper insulating layer and a lower insulating layer which will be described later, by the normal sputtering method, and the formed electrode surfaces are then formed in a given configuration by the normal etching method, respectively. Also, it is possible that one or more metals selected from the group consisting of copper, tungsten, aluminum, nickel, chrome, silver, platinum, tin, molybdenum, magnesium, and palladium is pasted and subjected to a printing process. Further, it is possible to form the metal films on the surfaces of the interelectrode insulating layer, or the surfaces of the upper insulating layer and the lower insulating layer which will be described later by means of a method of etching the metal films in a given pattern after the metal films have been formed through a process using the ion plating vapor deposition method, a plating process, or a chemical vapor deposition method, or a method of thermally spraying a high melting point metal such as molybdenum, tungsten, or tantalum.

It is preferable that the respective thicknesses of the first electrode and the second electrode be 0.2 to 30 μm, more preferably 1 to 30 μm in the case of using the laminated body having a metal foil on both of front and rear surfaces of the insulating film. When the thicknesses of the first electrode and the second electrode are smaller than 0.2 μm, pin holes or the like are liable to be produced in the electrodes, and it is difficult to manufacture the electrodes technically. On the contrary, when the thicknesses of the first electrode and the second electrode are larger than 30 μm, gaps that are attributable to the voids and the like are produced in the vicinity of the electrodes in the interior of the insulating material, thereby inducing a problem of the strength as an insulating material. Also, when the thicknesses of the first electrode and the second electrode are equal to or larger than 1 μm, it is possible to form the electrodes that are high in the reliability over the entire area, particularly even if the large size electrostatic chuck is formed.

In the case of forming the metal films by thermally spraying a given metal such as molybdenum, tungsten, or tantalum, it is preferable that the thickness of the first electrode be set to 20 to 100 μm, more preferably 20 to 30 μm. Also, it is preferable that the thickness of the second electrode be set to 20 to 100 μm, more preferably 20 to 30 μm. When both of those electrodes are smaller in thickness than 20 μm, voids are produced, and the metal films are difficult to function as the electrically conductive film.

Even in the case where the first electrode and the second electrode are formed by other methods, the thicknesses of the first electrode and the second electrode can be set to, for example, about 1 to 30 μm.

In the present invention, the cross-sectional configuration of a part or all of the first electrode taken along the depth direction of the sample attracting plane is not particularly limited. For example, the configuration of the first electrode can be selected from a rectangle, a square, a circle, a triangle, a quadrangle, or a polygon more than the quadrangle in number of corners. Also, the same as the first electrode is applicable to the cross-sectional configuration of a part or all of second electrode of the present invention which is taken along the depth direction of the sample attracting plane. The cross-sectional configurations of parts or all of first electrode and second electrode may be identical with each other, or may be different from each other.

In the interelectrode insulating layer according to the present invention, the first electrode and the second electrode can be made apart from each other so as to be out of contact with each other in the interior of the insulating material, and the first electrode and the second electrode need to be electrically insulated from each other. The interelectrode insulating layer may be formed of, for example, a resin layer made of one or more resins selected from the group consisting of polyimide, polyamide-imide, polyester, polyethylene terephthalate, epoxy, and acryl. Also, the interelectrode insulating layer may be formed of a ceramic layer made of one or more elements selected from the group consisting of aluminum oxide, aluminum nitride, silicon carbide, silicon nitride, zirconia, and titania. Further, the interelectrode insulating layer may be formed of a ceramic layer made of one or more elements selected from the group consisting of silicon and silicon dioxide. It is preferable that the interelectrode insulating layer may be formed of a resin layer made of one or more resins selected from the group consisting of polyimide, polyamide-imide, polyester, polyethylene terephthalate, and epoxy from the viewpoint of the productivity. It is more preferable that the interelectrode insulating layer may be made of polyimide from the viewpoint of dielectric breakdown strength or chemical resistance.

It is preferable that the resin layer be formed of one or more resin films. As the resin film of this type, there are specifically Kapton (trade name made by Du Pont-Toray Co., Ltd.), Upilex AD sheet (trade name made by Ube Industries, Ltd.), and Apical (trade name made by Kaneka Corp.). It is more preferable that the resin film be made of Kapton containing polyimide. When the resin film is used for the resin layer that forms the interelectrode insulating layers, there can be acquired the electrostatic chuck that is capable of forming the interelectrode insulating layer with a high reliability which eliminates the problem that voids exist between the first electrode and the second electrode as much as possible, and excellent in the dielectric breakdown strength. For example, the dielectric breakdown strength field intensity of Kapton (trade name made by Du Pont-Toray Co., Ltd.) is 160 MV/m, and the electrostatic chuck of the present invention having the Kapton as the interelectrode insulating layer is capable of exercising the excellent dielectric breakdown strength.

The thickness of the resin layer depends on the material to be used, and in the case where the resin layer is formed of, for example, a polyimide film, it is preferable that the thickness of the resin layer be 1 to 1000 $\mu m$, more preferably 50 to 500 $\mu m$. When the thickness of the interelectrode insulating layer is smaller than 1 $\mu m$, for example, in the case where the first electrode, the interelectrode insulating layer, and the second electrode are formed of a laminated body that is commercially available, respectively, that is, in the case where those members are formed of a laminated body having a metal foil on both of the front and back surfaces of the insulating film, respectively, it is difficult to commercially acquire the insulating film that is smaller than 1 $\mu m$, which constitutes the interelectrode insulating layer. On the contrary, when the thickness of the interelectrode is larger than 1000 $\mu m$, the obtained bipolar electrostatic chuck shows poor performance in the viewpoint of the thermal conductivity. Further, when the thickness of the interelectrode insulating layer is equal to or more than 50 $\mu m$, it is possible to form the bipolar electrostatic chuck by laminating insulating sheets made of polyimide which is commercially available with an adhesive agent. Also, when the thickness of the interelectrode insulating layer is equal to or less than 500 $\mu m$, it is possible to manufacture the bipolar electrostatic chuck by setting the thickness of a single insulating sheet that is commercially available to be thick, and the obtained electrostatic chuck is capable of exercising the necessary attracting performance by the low voltage operation of about several kilovolts.

In the case where the interelectrode insulating layer is formed of a ceramic layer, the ceramic layer can be formed by thermally spraying an elementary substance or a complex which consists of aluminum oxide, aluminum nitride, silicon carbide, carbon nitride, zirconia, yttria, magnesia, or titania due to atmospheric air or plasma. Also, it is possible to form the ceramic layer with the use of a sintered ceramic thin sheet.

In forming the ceramic layer by thermal spraying, the thickness of the interelectrode insulating layer can be set in a range of about 30 to 500 $\mu m$ through a general thermal spraying technique, and can be increased up to the thickness of about 3 mm at the maximum as occasion demands. When the sheet thickness is smaller than 30 $\mu m$, it is difficult to form an even layer. On the contrary, when the sheet thickness is larger than 500 $\mu m$, the gradient force becomes smaller. Also, it is preferable that the ceramic layer be formed with a material of 99.99% or higher in the degree of purity by thermal spray for the purpose of reducing an influence of contamination on a sample or a device due to a wear during operation of a semiconductor device manufacturing as much as possible or from the viewpoint that the ceramic layer is excellent in electrical insulation. Also, it is preferable to use a material that is high in heat conductance such as aluminum nitride from the viewpoint of efficiently cooling the sample that is held on the sample attracting plane.

In the case of forming the ceramic layer due to thermal spray, it is preferable to flatten an upper surface of the ceramic layer that has been subjected to thermal spray through a machining process. The flatness at this time is important from the positional relationship of the electrodes in the interior of the insulating material. It is preferable that the surface roughness Ra be set to about 5 to 50 $\mu m$, more preferably to be equal to or lower than 10 $\mu m$, from the viewpoint that the formation of an electric field is evened so that the attracting performance due to the gradient force is evened on the sample attracting plane.

On the other hand, in the case where the interelectrode insulating layer is formed of the sintered ceramic thin film, although the thickness can be arbitrarily designed, it is preferable that the thickness be set in a range of 30 to 500 $\mu m$. When the thickness is smaller than 30 $\mu m$, it is difficult to form an even layer whereas when the thickness is larger than 500 $\mu m$, the gradient force becomes smaller. Also, a material to be used is the same as that in the case of thermal spray.

Also, in the case where the interelectrode insulating layer is formed of a layer made of one or two selected from silicon and silicon dioxide, it is possible to form the interelectrode insulating layer that is 1 to 50 $\mu m$ in thickness, for example, by a CVD or a sputtering method.

Also, the insulating material according to the present invention needs to have the first electrode, the interelectrode insulating layer, and the second electrode in the order of distance from the sample attracting plane in the depth direction. It is preferable that the insulating material have the upper insulating layer, the first electrode, the interelectrode insulating layer, the second electrode, and the lower insulating layer in the order of distance from the sample attracting plane in the depth direction of the insulating material. In this example, the upper and lower direction indicated by the upper insulating layer and the lower insulating layer means that a side closer to the sample attracting plane is at an upper side whereas a side farther to the sample attracting plane is at a lower side when the sample attracting plane side of the surfaces of the insulating material is defined as upper.

The upper insulating layer can be formed of a resin layer made of one or more kinds of resins selected from the group consisting of polyimide having a thermoplastic polyimide on a lower surface, polyamide, polyester, polyethylene terephthalate, and epoxy. Also, the upper insulating layer can be formed of a ceramic layer made of one or more kinds selected from the group consisting of aluminum oxide, aluminum nitride, silicon carbide, silicon nitride, zirconia, yttria, magnesia, and titania. It is preferable that the upper insulating layer be made of polyimide having the thermoplastic polyimide on the lower surface from the viewpoints of the productivity and the insulation property.

Also, the lower insulating layer is made of the same material as that of the upper insulating layer including polyimide having the thermoplastic polyimide on the upper surface. It is preferable that the lower insulating layer be made of polyimide having the thermoplastic polyimide on the upper surface from the viewpoints of the productivity and the insulation performance.

In the case where the upper insulating layer is formed of the resin layer, it is preferable that the thickness of the upper insulating layer be set to 10 to 200 μm, more preferably 50 to 100 μm. When the thickness of the upper insulating layer is smaller than 50 μm, the durability of the film is adversely affected whereas when the thickness of the upper insulating layer is larger than 100 μm, the gradient force becomes smaller. Also, it is preferable that the thickness of the lower insulating layer that is formed of the resin layer be equal to or more than 10 μm, more preferably, equal to or more than 50 μm. When the thickness of the upper insulating layer is smaller than 50 μm, there may arise a problem of weakening of the dielectric breakdown strength or an increase in the capacitance. On the contrary, when the thickness of the upper insulating layer is larger than 200 μm, the heat conduction from the target to be attracted to the base becomes insufficient, that is, the cooling of the target to be attracted becomes insufficient.

On the other hand, in the case where each of or one of the upper insulating layer and the lower insulating layer is formed of the ceramic layer, the ceramic layer can be formed by thermally spraying a single substance or a compound which consists of materials such as aluminum oxide, aluminum nitride, silicon carbide, carbon nitride, zirconia, yttria, magnesia, or titania in the atmospheric air or in a plasma environment as in the case of the interelectrode insulating layer. Also, it is possible to form the ceramic layer with the use of a sintered ceramic thin sheet.

In forming the ceramic layer by thermal spraying, it is preferable that the thickness of the upper insulating layer be set to 10 to 200 μm for the same reason as that in the case of forming the upper insulating layer by the resin layer. Similarly, it is preferable that the thickness of the upper insulating layer be set to 10 to 200 μm for the same reason. A material to be used and the flatness are identical with those in the case of the interelectrode insulating layer.

In the case where each of or one of the upper insulating layer and the lower insulating layer is formed of a sintered ceramic thin sheet, the thickness of the upper insulating layer and the lower insulating layer can be arbitrarily designed. It is preferable that the thickness be set in a range of 10 to 200 μm for the same reason in the case of forming the upper or lower insulating layer by the above-mentioned resin layer or thermal spray. Also, a material to be used is identical with that in the case of thermal spray.

In the case where at least any one of the upper insulating layer, the lower insulating layer, and the interelectrode insulating layer is formed of the ceramic thin sheet, a joining means is required. For example, an joining method using an epoxy adhesive agent or soldering may be used. Also, it is possible that the ceramic thin sheet is kept at a high temperature, and the ceramic thin sheet is press-fitted in a vacuum furnace and joined together.

Also, in the present invention, it is possible that an electrically conductive layer is further formed on the surface of the insulating material, and the surface of the electrically conductive layer serves as the sample attracting plane. An electrically conductive layer is further formed on the surface of the insulating material, and the surface of the electrically conductive layer serves as the sample attracting plane, thereby making it possible to reduce the time constant of the electrostatic chuck. As a result, it is possible to eliminate the difficulty of dismounting the sample from the sample attracting plane as much as possible after turning off the voltage that has been applied to both of the electrodes of the bipolar electrode. The electrically conductive layer of this type can be formed by, for example, laminating an electrically conductive polyimide sheet or an electrically conductive fluoride resin on the surface of the insulating material, or mixing a filler such as carbon with the electrically conductive layer in order to provide the insulating material per se with the electrically conductive property. Thus, the electrostatic chuck can be formed.

As a method of manufacturing the bipolar electrostatic chuck according to the present invention, for example, the first electrode and the second electrode are first formed on both surfaces of the upper surface and the lower surface of the interelectrode insulating layer by the above-mentioned method. The polyimide film having the thermoplastic polyimide film on the lower surface is laminated on the interelectrode insulating layer having the first electrode and the second electrode, and then subjected to low-temperature thermal press molding under the conditions in which a treatment temperature is 100 to 250° C. and a pressure is 0.1 to 5 MPa, to thereby form the upper insulating layer. In addition, it is possible that the upper insulating layer, the first electrode, the interelectrode insulating layer, and the second electrode which are integrated together are laminated on the polyimide film having the thermoplastic polyimide film on the upper surface, and then subjected to the low temperature thermal compression molding as in the above manner, to thereby form the insulating material. Also, it is possible that the polyimide film having the thermoplastic polyimide film on the lower surface as the upper insulating layer, the interelectrode insulating layer having the first electrode and the second electrode formed on both of the upper and lower surfaces, and the polyimide film having the thermoplastic polyimide film on the upper surface as the lower insulating layer are sequentially laminated on each other, and then subjected to the low temperature thermal press molding under the conditions in which the treatment temperature is 100 to 250° C. and the pressure is 0.1 to 5 MPa, to thereby form the insulating material. Then, the insulating material is mounted on a metal base made of aluminum, aluminum alloy, metal matrix composite (MMC), stainless steel, or stainless alloy or on a ceramics substrate made of a ceramic material such as alumina or aluminum nitride, through the thermoplastic polyimide film or the epoxy thermal press bonding sheet, and then subjected to the low temperature thermal press molding under the conditions in which the treatment temperature is 100 to 250° C. and the pressure is 0.1 to 5 MPa, thereby being capable of completing the electrostatic chuck.

Alternatively, there is used a laminated body having a metal foil on both of the front and back surfaces including the polyimide sheet having a copper front surface layer such as Upicel N (trade name manufactured by Ube Industries, Ltd.)

or NEOFLEX (trade name manufactured by Mitsui Chemicals, Inc.), each of which is a polyimide copper laminate and commercially available. Then, the metal foil is etched in a given electrode pattern to form the first electrode, the interelectrode insulating layer, and the second electrode. Then, the upper insulating layer and the lower insulating layer are stuck onto the insulating material as in the above-mentioned manner. Further, the insulating material is stuck onto the metal base as in the above-mentioned manner to complete the electrostatic chuck. Also, the electrostatic chuck may be formed with an electrically conductive layer through the above-mentioned method.

Effects of the Invention

The bipolar electrostatic chuck according to the present invention is structured to have the first electrode, the interelectrode insulating layer, and the second electrode in the order of distance from the sample attracting plane in the depth direction of the insulating material. With the above structure, the bipolar electrostatic chuck according to the present invention is excellent in electrical insulation, and is capable of shortening the distance between the first electrode and the second electrode as much as possible, thereby exercising the excellent attracting performance. As a result, the bipolar electrostatic chuck according to the present invention is excellent in the flatness of the held sample, and exercises the sufficient attracting performance with respect to a glass substrate that exceeds 1 m×1 m so as to accept the recent large size glass substrate, a silicon wafer that is equal to or more than 300 mm in diameter, or the like. Also, the bipolar electrostatic chuck according to the present invention is capable of exercising the excellent attracting performance. As a result, the bipolar electrostatic chuck according to the present invention is capable of conducting in the low voltage operation, is advantageous in the economical viewpoint, eliminates the discharge problem as much as possible, and is high in the reliability.

In addition, the bipolar electrostatic chuck according to the present invention reduces an area in which the first electrode and the second electrode are overlapped with each other when the sample attracting plane is viewed in the depth direction as much as possible, thereby making it possible to reduce the capacitance of the electrostatic chuck, and also making it possible to eliminate the difficulty of dismounting the sample from the sample attracting plane after turning off the voltage that has been applied to both of the electrodes. Further, in the case where an electrically conductive layer is formed on the surface of the insulating material, and the surface of the electrically conductive layer serves as the sample attracting plane, the bipolar electrostatic chuck according to the present invention is capable of reducing the time constant of the electrostatic chuck regardless of the area in which the first electrode and the second electrode are overlapped with each other in the normal line direction of the sample attracting plane. The bipolar electrostatic chuck according to the present invention is also capable of eliminating the difficulty of dismounting the sample from the sample attracting plane after a voltage has been applied to both of the electrodes.

DESCRIPTION OF THE SYMBOLS

Figure 1:
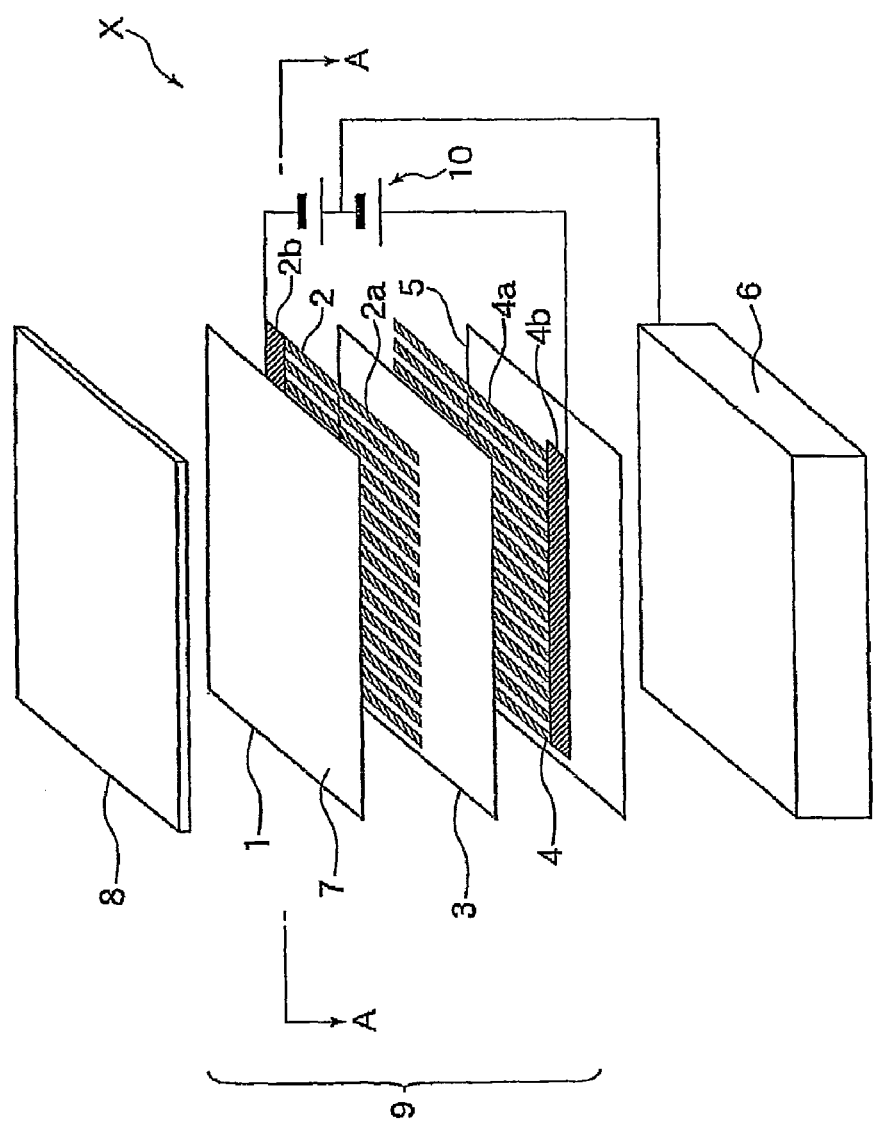
FIG. 1 is an explanatory exploded perspective view showing a bipolar electrostatic chuck X according to a first embodiment of the present invention.

Reference symbol X is a bipolar electrostatic chuck; reference numerals 1 and 11 are upper insulating layers; 2, 12, 22, 32, 42, 52, and 62 are first electrodes; 2a is a band-like portion; 2b is a root portion; 12a is a gap portion; 22a is a circular portion, 22b is an annular portion; 22c is a connection portion; 32a and 42a are opening portions; 3, 13, and 23 are interelectrode insulating layers; 4, 14, 24, 34, 44, 54, and 64 are second electrodes; 4a and 14a are band-like portions; 4b and 14b are root portions; 34a and 44a are center rings; 34b and 44b are annular portions; 34c and 44c are connection portions; 5 and 15 are lower insulating layers; 6 is a metal base; 7 is a sample attracting plane; 8 is a glass substrate; 9 is an insulating material; and 10 is a DC power source.

BEST MODES FOR CARRYING OUT THE INVENTION

Hereinafter, a description will be given in more detail of preferred embodiment modes of the present invention with reference to the accompanying drawings. Note that a bipolar electrostatic chuck according to the present invention is not limited to the following embodiments.

First Embodiment

FIG. 1 shows an explanatory exploded perspective view of a bipolar electrostatic chuck X according to a first embodiment of the present invention. The bipolar electrostatic chuck X includes an upper insulating layer 1 that is formed of a polyimide film having a thermoplastic polyimide film on a lower surface thereof which is 100 mm in height×100 mm in width, 50 μm in thickness, and a dielectric constant $\in=3.5$, a first electrode 2 made of copper which is 3 μm in thickness, and an interelectrode insulating layer 3 that is formed of a polyimide film which is 100 mm in height×100 mm in width, 50 μm in thickness, and a dielectric constant $\in=3.5$. The bipolar electrostatic chuck X also includes a second electrode 4 made of copper that is 3 μm in thickness, a lower insulating layer 5 that is formed of a polyimide film having a thermoplastic polyimide film on an upper surface thereof which is 100 mm in height×100 mm in width, 50 μm in thickness, and a dielectric constant $\in=3.5$, and a metal base 6 made of aluminum which is 100 mm in height×100 mm in width×10 mm in thickness. Also, the bipolar electrostatic chuck X has a glass substrate 8 that is 100 mm in height×100 mm in width× 0.2 mm in thickness, and a dielectric constant $\in=5.5$ attracted and held on the sample attracting plane 7 which is an upper surface of the upper insulating layer 1.

The bipolar electrostatic chuck X according to the first embodiment is formed as follows. First, with the use of NEOFLEX (trade name manufactured by Mitsui Chemicals, Inc.) of a polyimide copper laminated sheet having copper surface layers on both of upper and lower surfaces thereof (both of front and rear surfaces), the resist pattern of a given electrode is formed on the both of the upper and lower surfaces by serigraph. Then, the product is etched by using a caustic agent which is made of ferric chloride. In this manner, there are formed the first electrode 2 of band-like comb teeth having an area which is 80 mm in height× and 80 mm in width, the interelectrode insulating layer 3 (polyimide film), and the second electrode 4 of the band-like comb teeth having an area which is 80 mm in height×80 mm in width.

Subsequently, the polyimide film having the thermoplastic polyimide film on the lower surface thereof which forms the upper insulating layer 1, the first electrode 2, the polyimide film (interelectrode insulating layer 3), the second electrode 4, and the polyimide film having the thermoplastic polyimide film on the upper surface thereof which forms the lower insulating layer 5 are sequentially laminated on each other in the stated order, and then are subjected to the low temperature thermal press molding under the conditions where the treatment temperature is 150° C. and the pressure is 2 MPa, to thereby form the insulating material 9. Then, the insulating material 9 is subjected to the low temperature thermal press bonding process under the same conditions as those described above through the thermoplastic polyimide film (not shown) to be fixed to the metal base 6, thereby completing the bipolar electrostatic chuck X.

The bipolar electrostatic chuck X is connected to a DC power supply 10 in such a manner that the first electrode 2 side is a negative electrode while the second electrode is a positive electrode. Also, the metal base 6 functions as a ground electrode. A voltage that is applied to the electrodes exercises the same attracting effect as that described above even if the first electrode 2 side is the positive electrode and the second electrode 4 side is the negative electrode. Also, it is possible that any one of the first electrode 2 and the second electrode 4 is set to 0 V (GND), and the remaining electrode is set to a positive electrode or a negative electrode to develop a potential difference between the respective electrodes.

Figure 2:
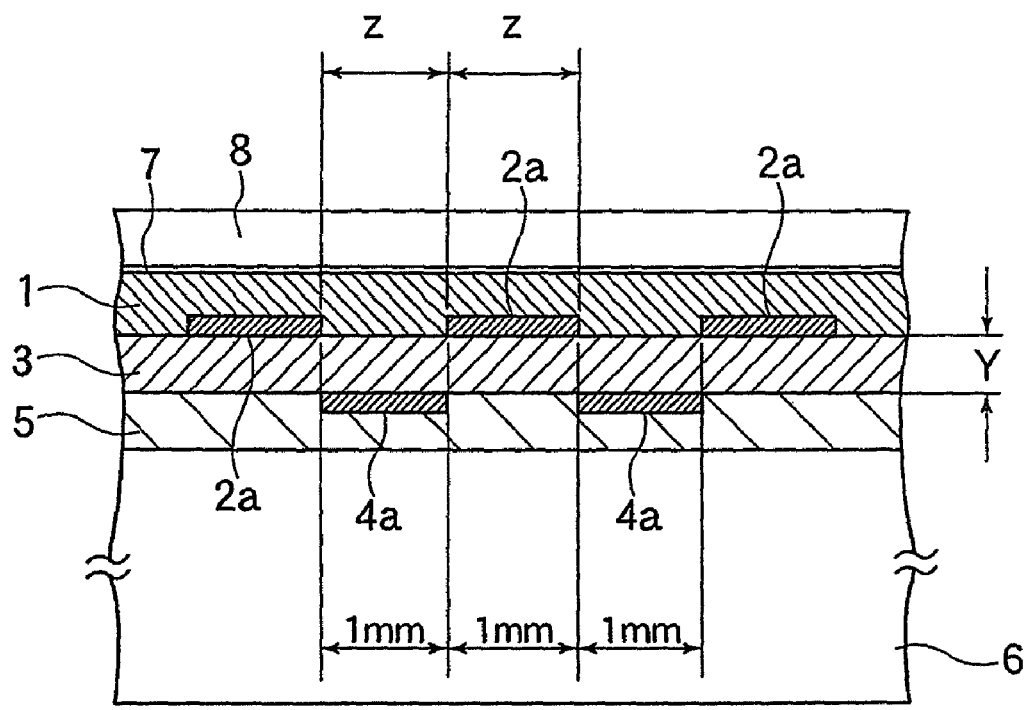
FIG. 2 is an explanatory cross-sectional view (corresponding to a part of a section A-A of FIG. 1) showing the bipolar electrostatic chuck X according to the first embodiment.
Figure 3:
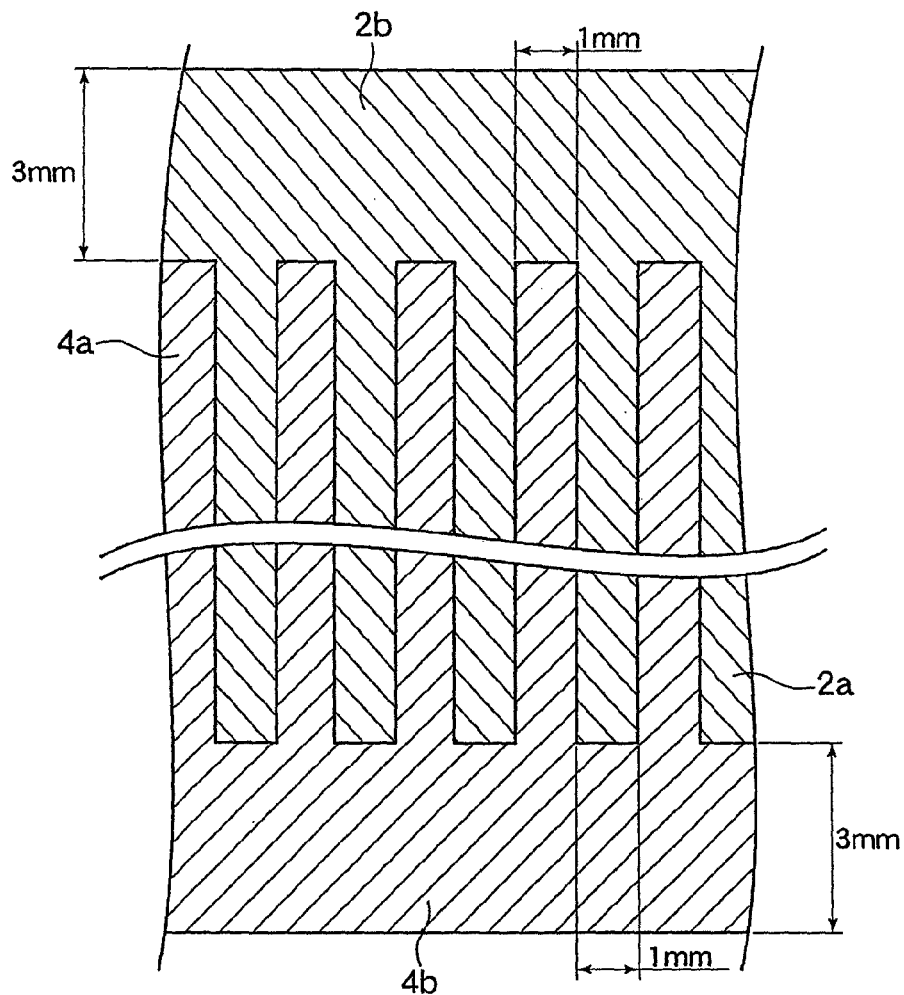
FIG. 3 is an explanatory partial plan view showing a first electrode and a second electrode of the bipolar electrostatic chuck X, viewed in a depth direction of the sample attracting plane according to the first embodiment.

FIG. 2 shows an explanatory cross-sectional view (a part of a cross-section A-A of FIG. 1) of the bipolar electrostatic chuck X according to the first embodiment. FIG. 3 shows an explanatory partial plan view of the first electrode 2 and the second electrode 4 of the bipolar electrostatic chuck X according to the first embodiment, viewed in a depth direction of the sample attracting plane. Note that reference symbol "z" shown in FIG. 2 denotes the band-like electrode width and the gap between the electrodes which will be described in the following fifth test example.

As described above, the first electrode 2 is formed in the shape of the band-like comb teeth, the second electrode 4 is also formed in the shape of the band-like comb teeth, and those two band-like comb teeth are alternately arranged in such a manner that the first electrode 2 and the second electrode 4 are overlapped in a line with each other when the sample attracting plane 7 is viewed in the depth direction. The band-line portions 2a of the first electrode 2 which is formed in the shape of the band-like comb teeth are 1 mm in electrode width and 3 μm in thickness, the band-like portions 2a are arranged at pitches of 1 mm, and are integrated with a root portion 2b that is 3 mm in electrode width and 3 μm in thickness, to thereby form the band-like comb teeth. Similarly, the band-line portions 4a of the second electrode 4 are 1 mm in electrode width and 3 μm in thickness, the band-like portions 4a are arranged at pitches of 1 mm, and are integrated with a root portion 4b that is 3 mm in electrode width and 3 μm in thickness, to thereby form the band-like comb teeth. Also, a distance Y between the first electrode 2 and the second electrode 4 is 50 μm corresponding to a value of the thickness of the interelectrode insulating layer 3.

Incidentally, because the polyimide film that forms the interelectrode insulating layer 3 is 160 MV/m in dielectric breakdown strength, the bipolar electrostatic chuck X according to the first embodiment has a dielectric breakdown strength of 8 kV.

Second Embodiment

Figure 4:
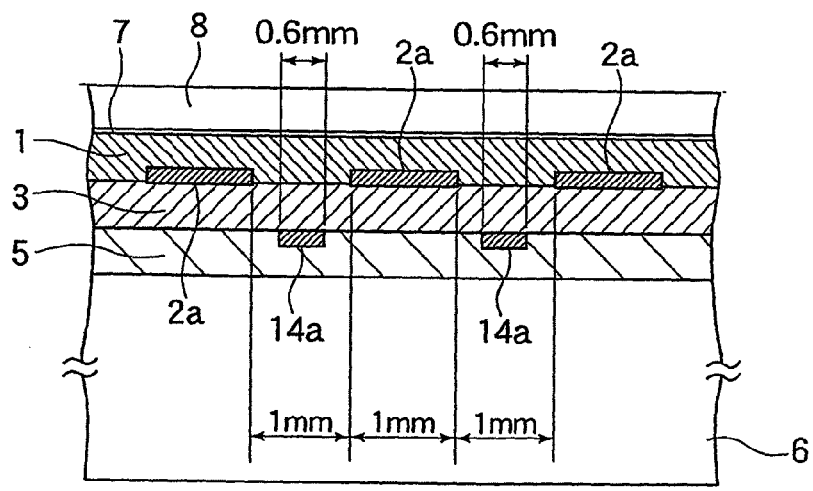
FIG. 4 is an explanatory cross-sectional view showing a bipolar electrostatic chuck X according to a second embodiment of the present invention.
Figure 5:
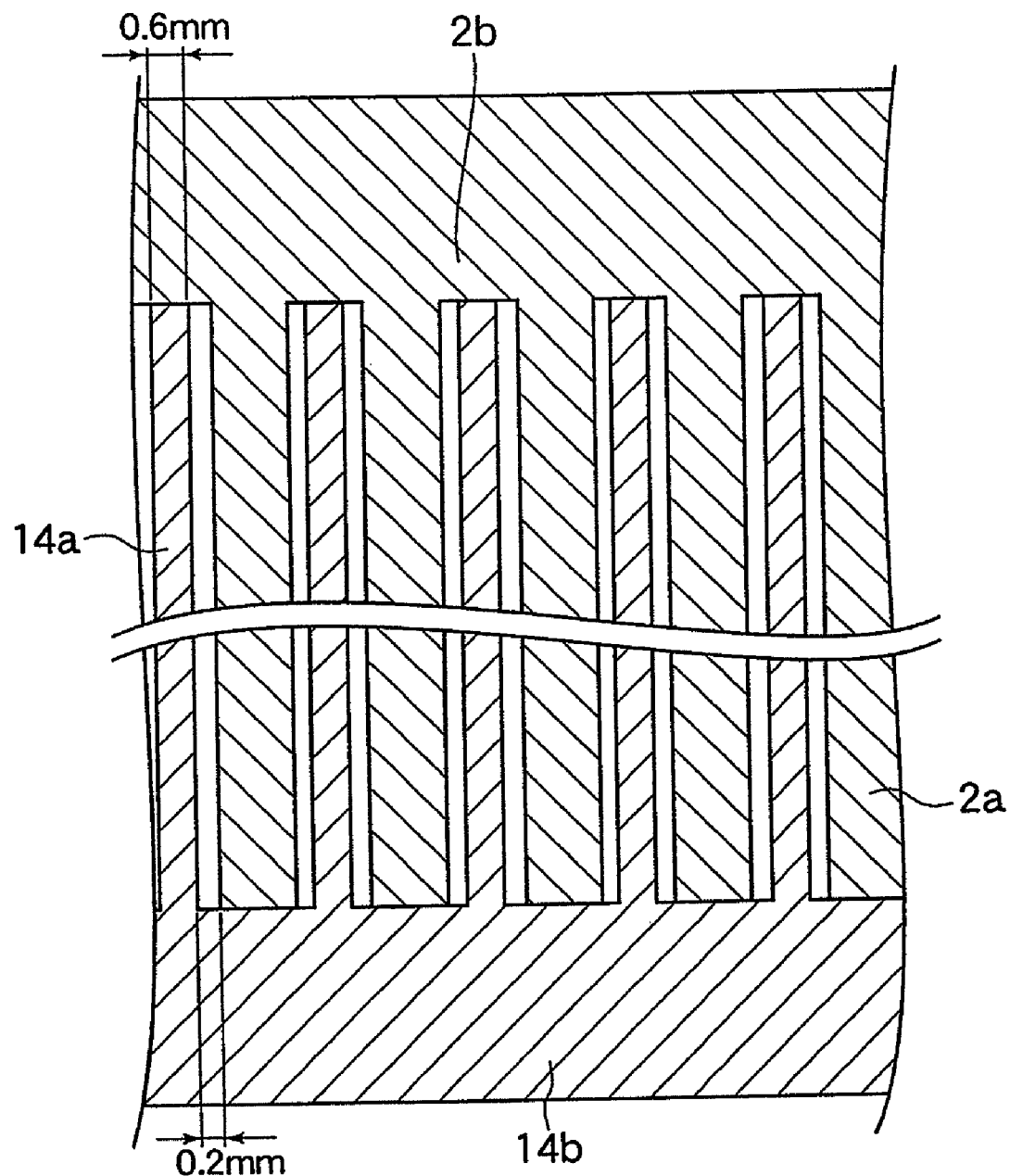
FIG. 5 is an explanatory partial plan view showing a first electrode and a second electrode of the bipolar electrostatic chuck X, viewed in a depth direction of the sample attracting plane according to the second embodiment.

FIG. 4 shows an explanatory cross-sectional view of a bipolar electrostatic chuck X according to a second embodiment of the present invention. FIG. 5 shows an explanatory partial plan view of a first electrode 2 and a second electrode 14 of the bipolar electrostatic chuck X according to the second embodiment, viewed in a depth direction of the sample attracting plane 7.

In the bipolar electrostatic chuck X according to the second embodiment, an electrode width of the band-like portions 14a of the second electrode 14 is set to 0.6 mm, and the band-like portions 14a of the second electrode 14 are arranged in the center of gaps (1 mm) which are formed between the respective band-like portions 2a of the first electrode 2. Band-like comb teeth of the first electrode 2 and band-like comb teeth of the second electrode 14 are alternately arranged, and the first electrode 2 and the second electrode 14 are arranged when the sample attracting plane 7 is viewed in the depth direction in such a manner that the leading edges of the respective band-like portions 2a and 14a are overlapped in linear contact with respective root portions 2b and 14b (a distance between the band-like portions 2a of the first electrode 2 and the band-like portions 14a of the second electrode 14 is 0.2 mm when the sample attracting plane 7 is viewed in the depth direction). The conditions other than the above conditions are set to be identical with those of the first embodiment, thereby completing the bipolar electrostatic chuck X according to the second embodiment.

Third Embodiment

Figure 6:
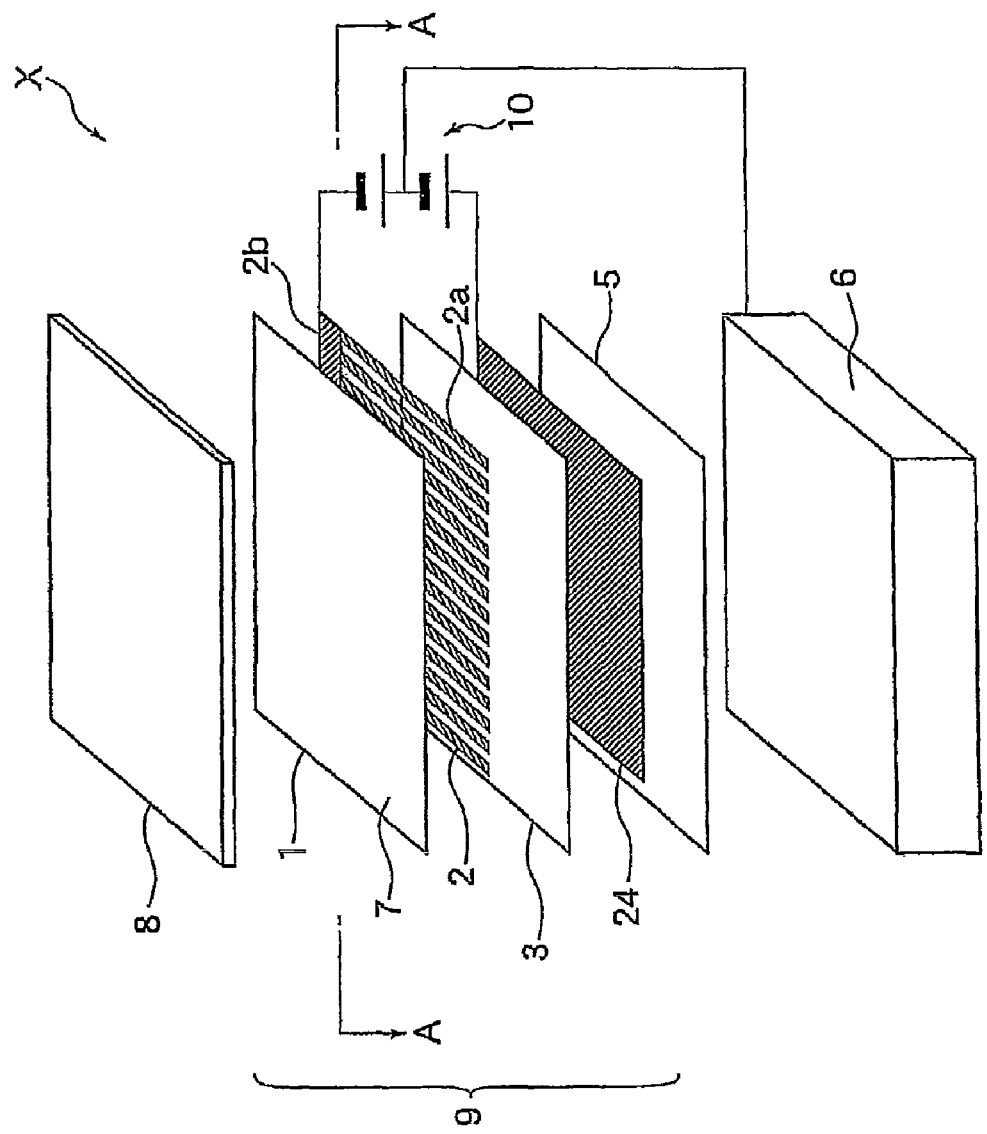
FIG. 6 is an explanatory exploded perspective view showing a bipolar electrostatic chuck X according to a third embodiment of the present invention.
Figure 7:
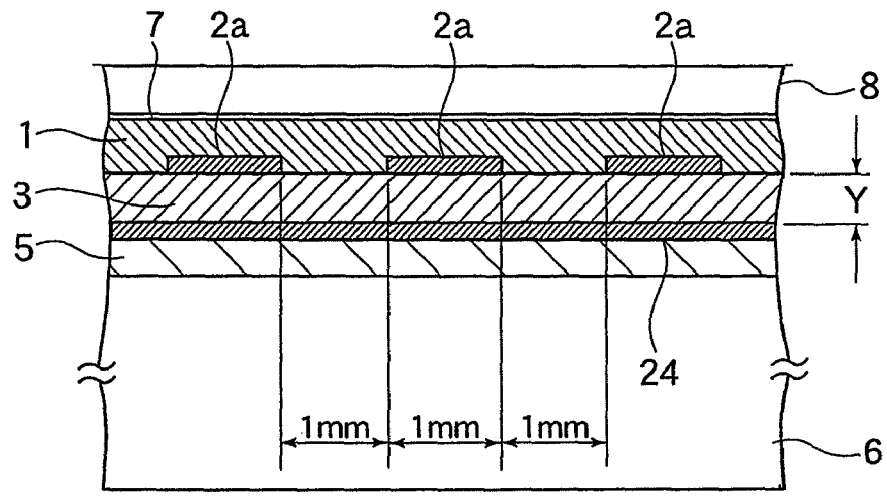
FIG. 7 is an explanatory cross-sectional view (corresponding to a part of a section A-A of FIG. 6) showing the bipolar electrostatic chuck X according to the third embodiment.
Figure 8:
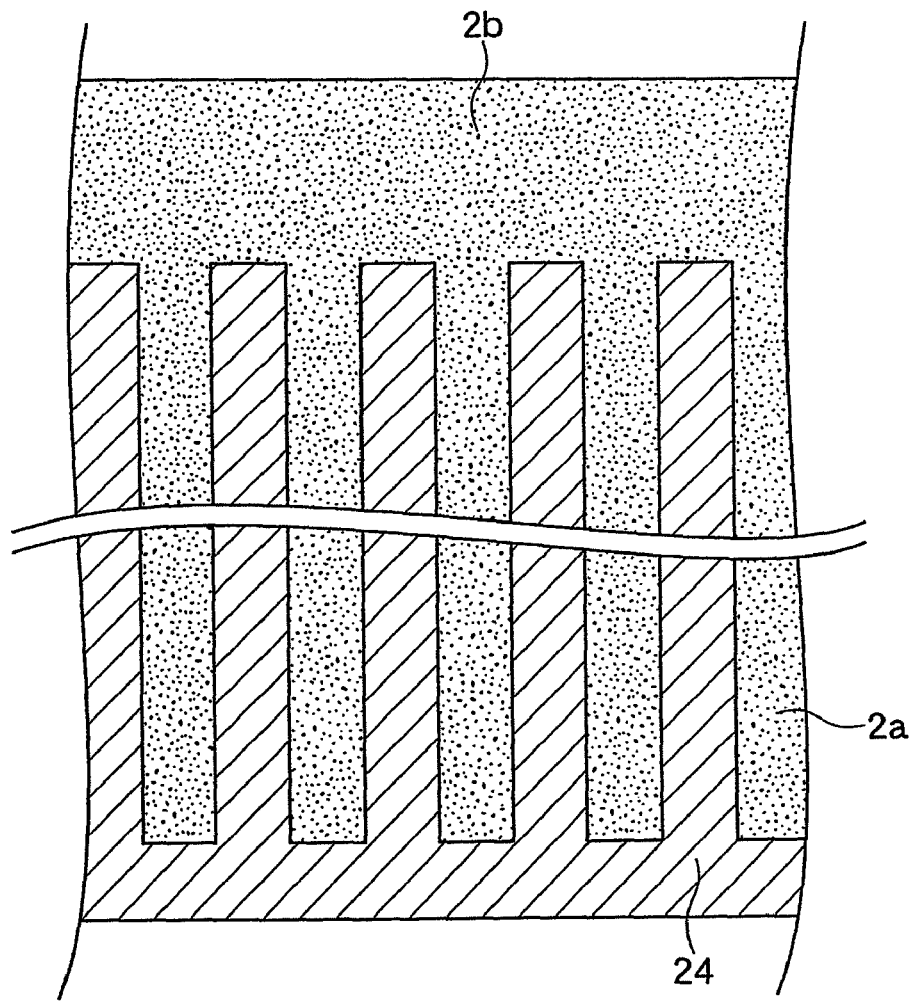
FIG. 8 is an explanatory partial plan view showing a first electrode and a second electrode of the bipolar electrostatic chuck X, viewed in a depth direction of the sample attracting plane according to the third embodiment.

FIG. 6 shows an explanatory exploded perspective view of a bipolar electrostatic chuck X according to a third embodiment of the present invention. FIG. 7 shows an explanatory cross-sectional view (a part of a cross-section A-A of FIG. 6) of the bipolar electrostatic chuck X according to the third embodiment. FIG. 8 shows an explanatory partial plan view of a first electrode 2 and a second electrode 24 of the bipolar electrostatic chuck X according to the third embodiment, viewed in a depth direction of the sample attracting plane 7. In FIG. 8, a dotted area portion represents a portion in which the second electrode 24 is overlapped with the first electrode 2 when the sample attracting plane 7 is viewed in the depth direction.

In the bipolar electrostatic chuck X according to the third embodiment, the conditions other than a condition in which the second electrode 24 is formed in a plane having a planar area that is 80 mm in height×80 mm in width are set to be identical with those of the first embodiment, to thereby complete the bipolar electrostatic chuck X.

Fourth Embodiment

Figure 9:
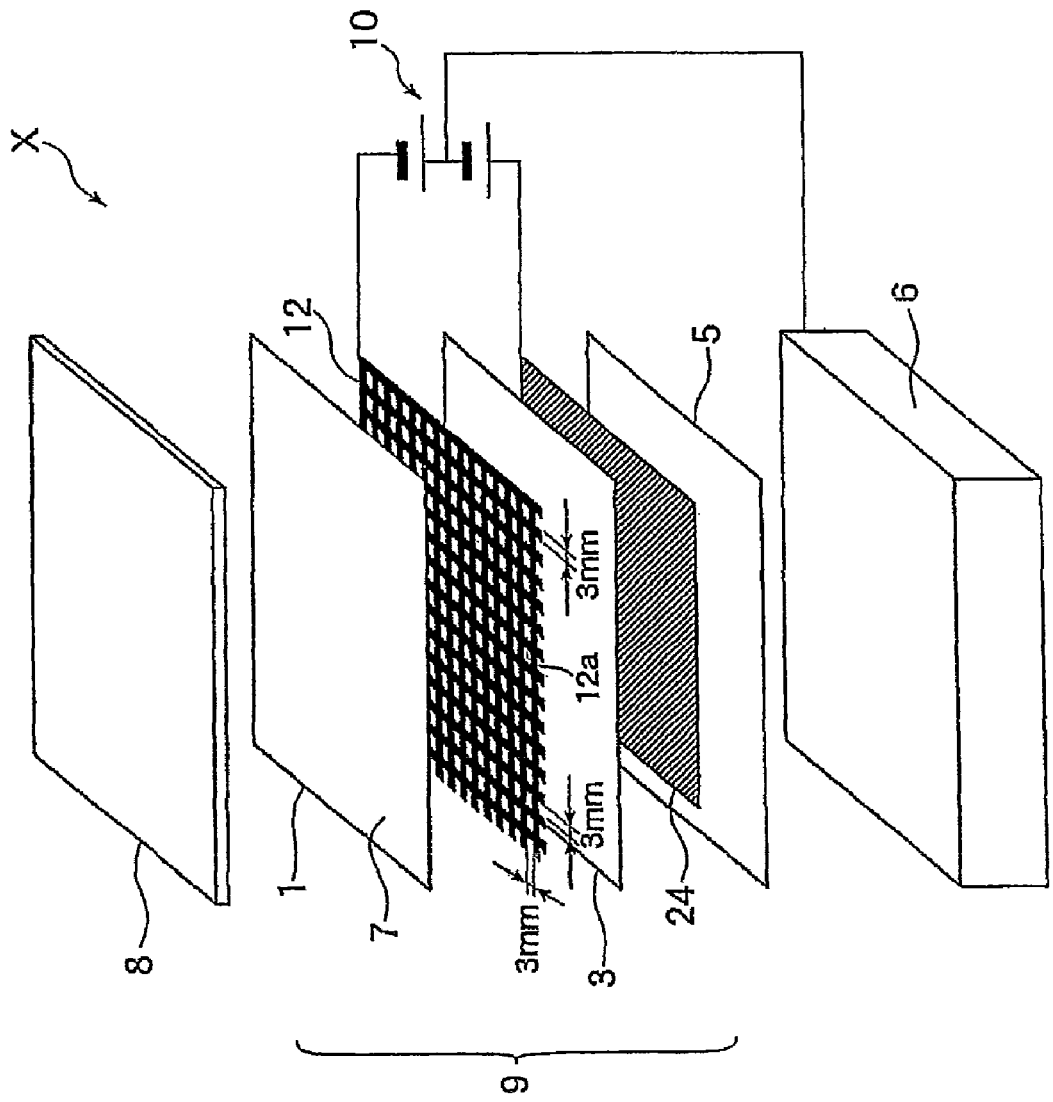
FIG. 9 is an explanatory exploded perspective view showing a bipolar electrostatic chuck X according to a fourth embodiment of the present invention.
Figure 10:
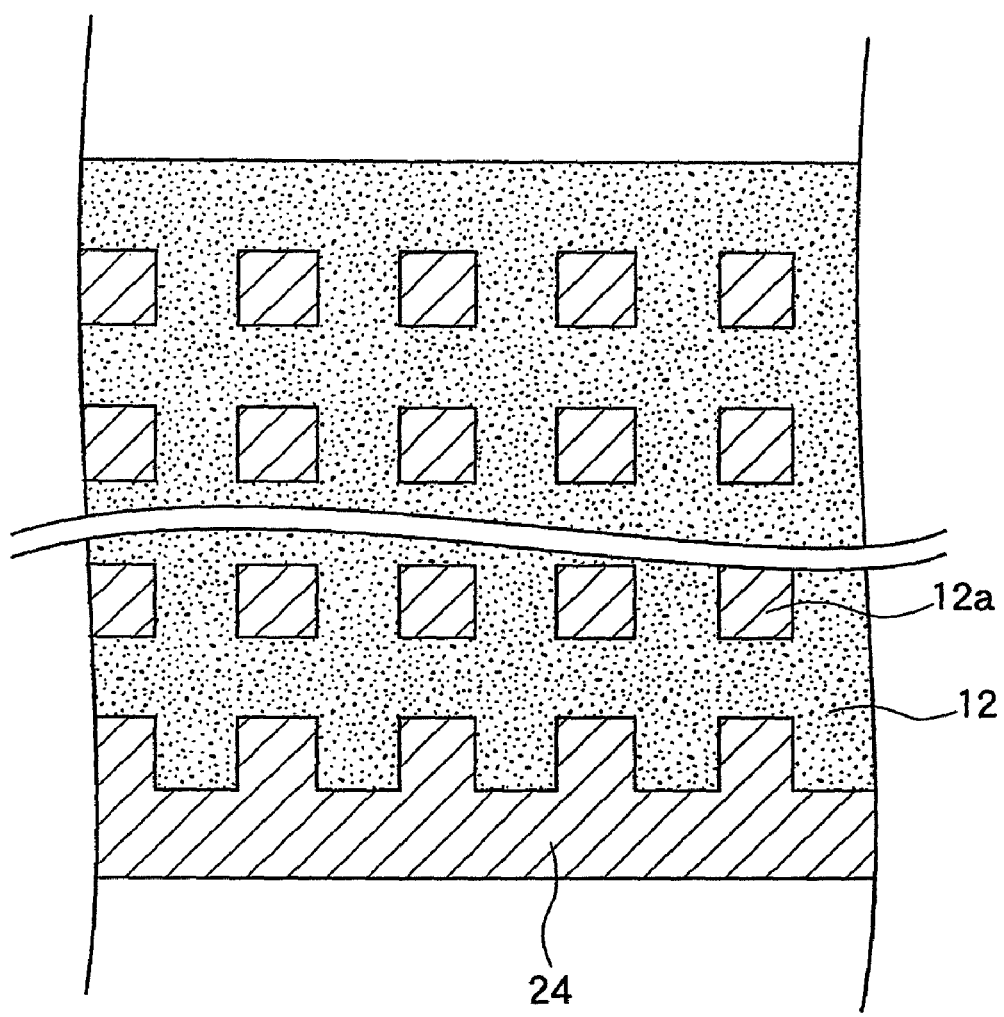
FIG. 10 is an explanatory partial plan view showing a first electrode and a second electrode of the bipolar electrostatic chuck X, viewed in a depth direction of the sample attracting plane according to the fourth embodiment.

FIG. 9 shows an explanatory exploded perspective view of a bipolar electrostatic chuck X according to a fourth embodiment of the present invention. FIG. 10 shows an explanatory partial plan view of a first electrode 12 and a second electrode 24 of the bipolar electrostatic chuck X according to the fourth embodiment, viewed in a normal line direction of the sample attracting plane 7. Note that a dotted area portion shown in FIG. 10 represents a portion in which the second electrode 24 is overlapped with the first electrode 12 when the sample attracting plane 7 is viewed in the depth direction.

In the bipolar electrostatic chuck X according to the fourth embodiment, the first electrode 12 is formed in a curb configuration where gap portions 12a that are 3 mm in height×3 mm in width are arranged at pitches of 3 mm in height and width (electrode width 3 mm which forms the curb) in an area that is 100 mm in height×100 mm in width. The conditions other than the above conditions are set to be identical with those of the third embodiment, to thereby complete the bipolar electrostatic chuck X according to the fourth embodiment. Note that in the case where the first electrode 12 is formed in the curb configuration as described above, a potential supply is possible even if a part of the electrode is disconnected due to an external impact or the like.

Fifth Embodiment

Figure 11:
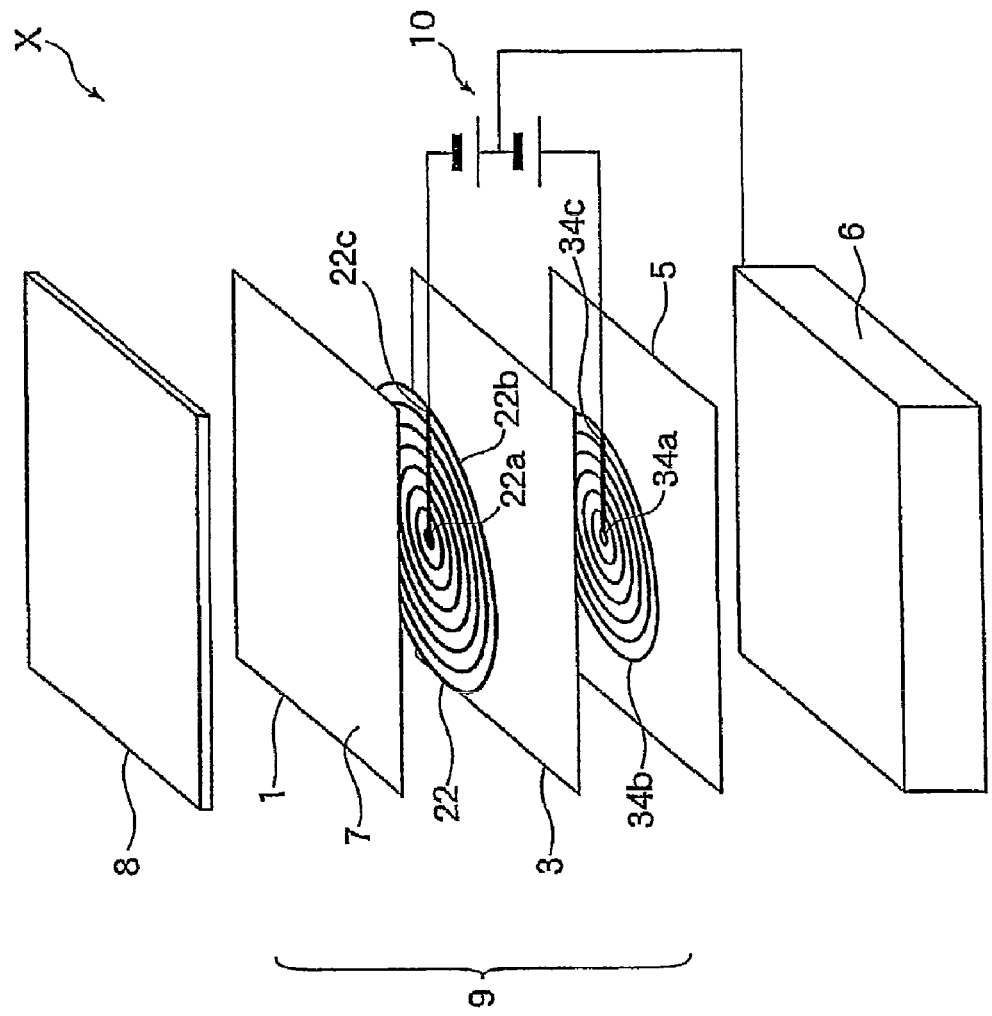
FIG. 11 is an explanatory exploded perspective view showing a bipolar electrostatic chuck X according to a fifth embodiment of the present invention.
Figure 12:
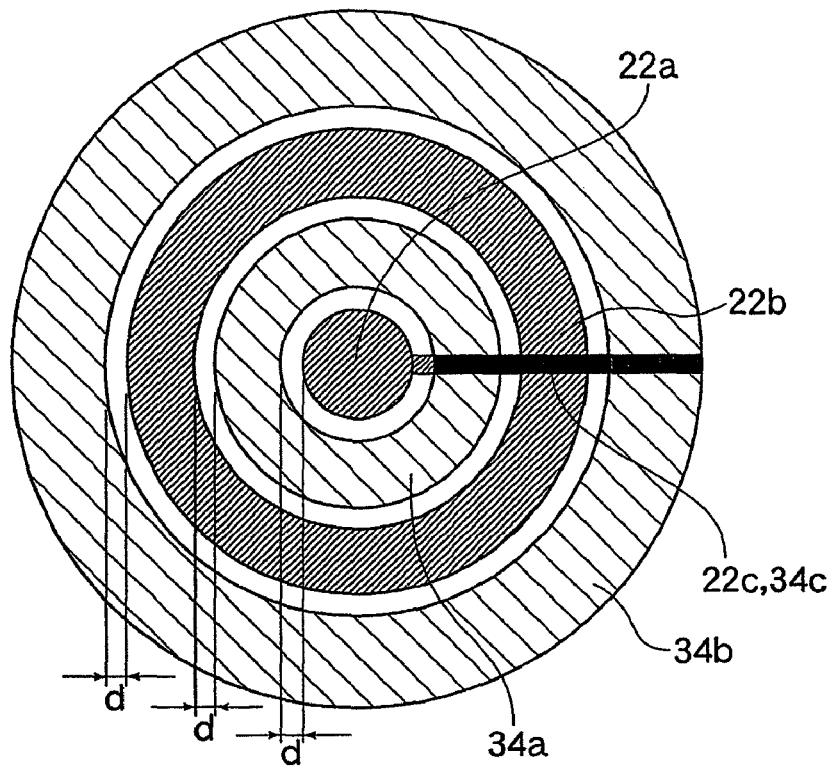
FIG. 12 is an explanatory partial plan view showing a first electrode and a second electrode of the bipolar electrostatic chuck X, viewed in a depth direction of the sample attracting plane according to the fifth embodiment.

FIG. 11 shows an explanatory exploded perspective view of a bipolar electrostatic chuck X according to a fifth embodiment of the present invention. FIG. 12 shows an explanatory partial plan view of the vicinity of the center of a first electrode 22 and a second electrode 34 of the bipolar electrostatic chuck X according to the fifth embodiment, viewed in a depth direction of the sample attracting plane 7. Note that a dark (blacked-out) portion shown in FIG. 12 represents a portion in which the second electrode 34 is overlapped with the first electrode 22 when the sample attracting plane 7 is viewed in the depth direction.

The first electrode 22 according to the fifth embodiment centers on a circular portion 22a that is 2 mm in radius, and has a concentric annular portion 22b in such a manner that the electric width is 3 mm, and an interval between the respective electrodes is 5 mm. The first electrode 22 also has a connection portion 22c that is 1 mm in electrode width and connects the circular portion 22a and the annular portion 22b to each other, and forms a concentric circular electrode that is 100 mm in radius as a whole. On the other hand, the second electrode 34 centers on a center ring 34a that is 3 mm in inner diameter and 6 mm in outer diameter, and has a concentric annular portion 34b in such a manner that the electric width is 3 mm, and an interval between the respective electrodes is 5 mm. The second electrode 34 also has a connection portion 34c that is 1 mm in electrode width and connects the center ring 34a and the annular portion 34b to each other, and forms a concentric circular electrode that is 100 mm in radius as a whole. The conditions other than the above conditions are set to be identical with those of the first embodiment, thereby completing the bipolar electrostatic chuck X according to the fifth embodiment.

When the first electrode 22 and the second electrode 34 according to the fifth embodiment are viewed in the depth direction of the sample attracting plane 7, both of the annular portions 22b and 34b have a distance d=1 mm, and the connection portion 34c of the second electrode 34 is arranged to be overlapped with the connection portion 22c of the first electrode 22 when the sample attracting plane 7 is viewed in the depth direction.

Sixth Embodiment

Figure 13:
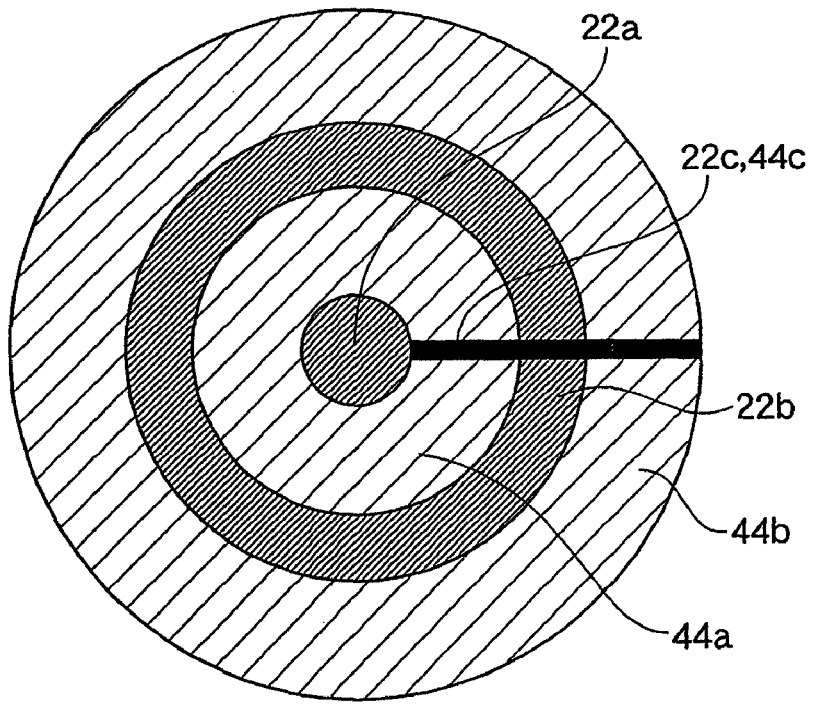
FIG. 13 is an explanatory partial plan view showing a first electrode and a second electrode of the bipolar electrostatic chuck X, viewed in a depth direction of the sample attracting plane according to a sixth embodiment of the present invention.

FIG. 13 shows an explanatory partial plan view of a first electrode 22 and a second electrode 44 of a bipolar electrostatic chuck X according to a sixth embodiment of the present invention, viewed in a depth direction of the sample attracting plane 7. Note that a dark (blacked-out) portion shown in FIG. 13 represents a portion in which the second electrode 44 is overlapped with the first electrode 22 when the sample attracting plane 7 is viewed in the depth direction.

The second electrode 44 according to the sixth embodiment centers on a center ring 44a that is 2 mm in inner diameter and 7 mm in outer diameter, and has a concentric annular portion 44b in such a manner that the electric width is 5 mm, and an interval between the respective electrodes is 3 mm. The second electrode 44 also has a connection portion 44c that connects the center ring 44a and the annular portion 44b to each other, and forms a concentric circular electrode that is 100 mm in radius as a whole. The conditions other than the above conditions are set to be identical with those in the fifth embodiment, thereby completing the bipolar electrostatic chuck X according to the sixth embodiment.

When the first electrode 22 and the second electrode 44 according to the sixth embodiment are viewed in the depth direction of the sample attracting plane 7, the annular portions 22b and 44b are overlapped in circular line, and the connection portion 44c of the second electrode 44 is arranged to be overlapped with the connection portion 22c of the first electrode 22 when the sample attracting plane 7 is viewed in the depth direction.

Seventh Embodiment

Figure 14:
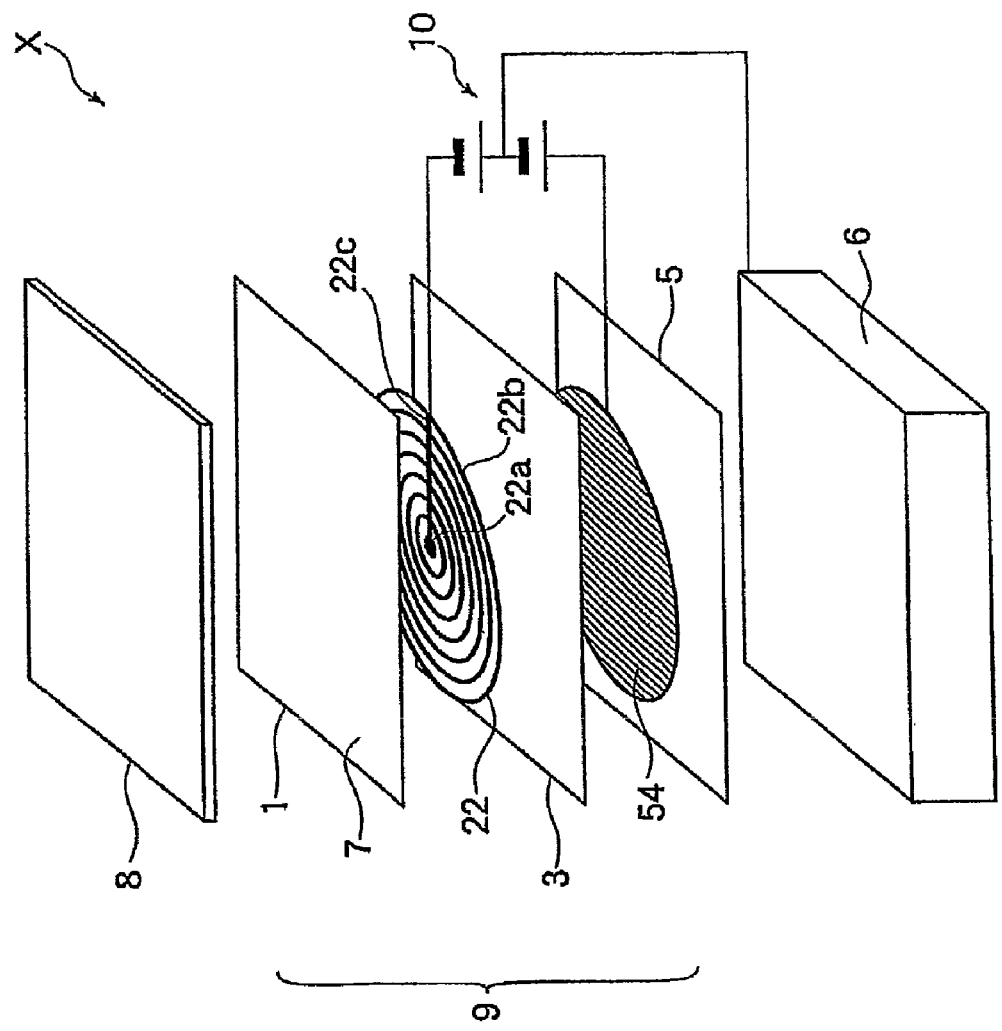
FIG. 14 is an explanatory exploded perspective view showing a bipolar electrostatic chuck X according to a seventh embodiment of the present invention.

FIG. 14 shows an explanatory exploded perspective view of a bipolar electrostatic chuck X according to a seventh embodiment of the present invention. A second electrode 54 according to the seventh embodiment is so formed as to have a circular area that is 100 mm in radius. The conditions other than the above conditions are set to be identical with those of the fifth embodiment, thereby completing the bipolar electrostatic chuck X according to the seventh embodiment.

Eighth Embodiment

Figure 15:
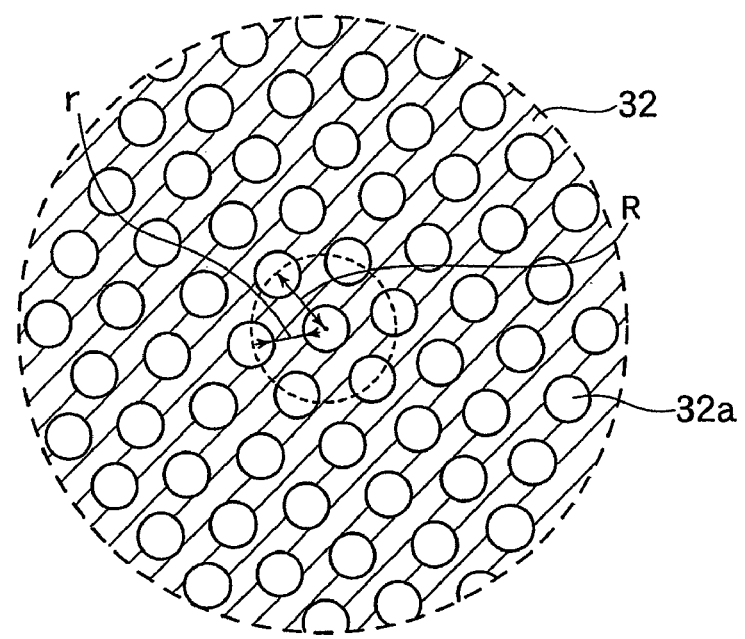
FIG. 15 is an explanatory partial plan view showing a first electrode of a bipolar electrostatic chuck X according to an eighth embodiment of the present invention.

FIG. 15 shows an explanatory partial plan view of a first electrode 32 of a bipolar electrostatic chuck X according to an eighth embodiment of the present invention. The first electrode 32 has a circular area that is 3 μm in thickness and 300 mm in diameter, and circular openings 32a that are 0.6 mm in radius evenly exist in the circular area. FIG. 15 is an explanatory partial plan view showing a state in the vicinity of the center of the circular area. When attention is paid to one opening 32a in the first electrode 32, six openings 32a exist around the subject opening 32a, and those sixth openings 32a are arranged to have respective centers thereof positioned at vertexes of regular hexagon. A distance R between the center of the central opening 32a and the center of the openings 32a that are positioned at the vertexes of the regular hexagon is 1.5 mm, and an interval r between the central opening 32a and the adjacent openings 32a is 0.3 mm.

The conditions other than the above conditions are set to be identical with those of the third embodiment, thereby completing the bipolar electrostatic chuck X according to the eighth embodiment. When the openings 32a are thus formed in the circular configuration, the corners of the openings are relatively easily processed, thereby making it possible to form an even gradient force.

Ninth Embodiment

Figure 16:
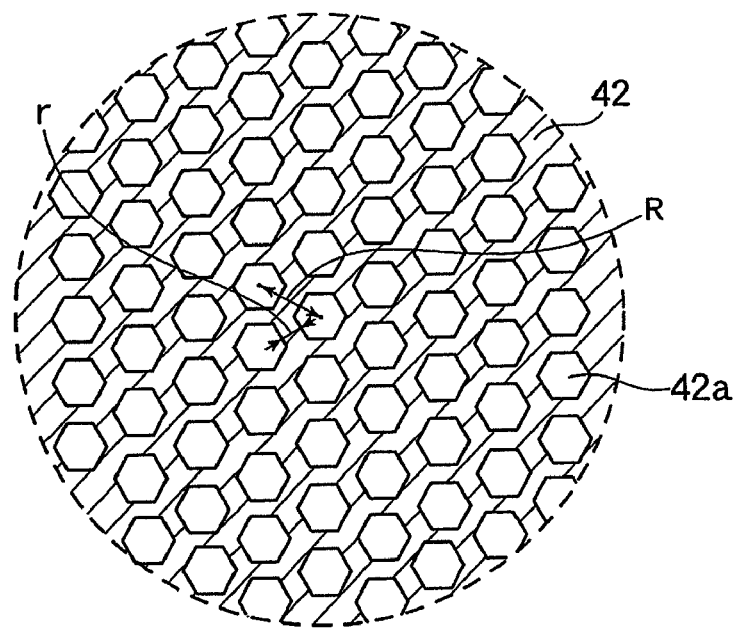
FIG. 16 is an explanatory partial plan view showing a first electrode of a bipolar electrostatic chuck X according to a ninth embodiment of the present invention.

FIG. 16 shows an explanatory partial plan view of a first electrode 42 of a bipolar electrostatic chuck X according to a ninth embodiment of the present invention. The first electrode 42 has a circular area that is 3 μm in thickness and 300 mm in diameter, and openings 42a of regular hexagons that are 0.6 mm in each side evenly exist in the circular area. FIG. 16 is an explanatory plan view showing a state in the vicinity of the center of the circular area. When attention is paid to one opening 42a in the first electrode 42, six openings 42a are arranged around the subject opening 42a in such a manner that the respective sides are in parallel to each other. A distance R between the center of the central opening 42a and the center of the adjacent openings 42a is 1.5 mm, and an interval r between the adjacent openings 42a is 0.3 mm.

The conditions other than the above conditions are set to be identical with those of the third embodiment, thereby completing the bipolar electrostatic chuck X according to the ninth embodiment. In the first electrode 42 having the regular hexagonal openings 42a as described above, because the line width of the electrode can be evenly formed, the more even attracting performance can be realized.

Tenth Embodiment

Figure 17:
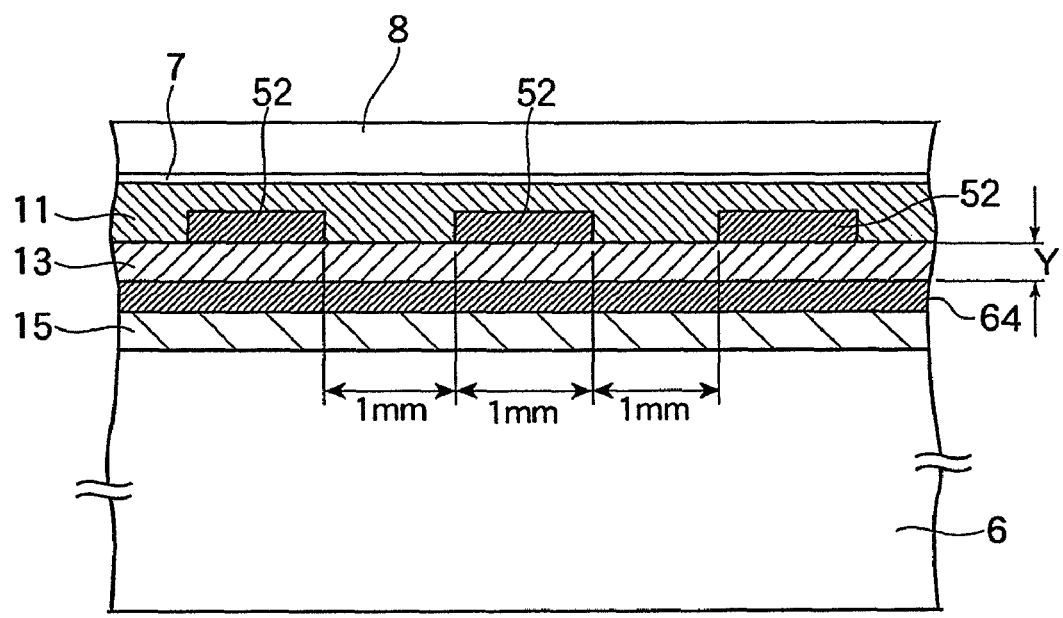
FIG. 17 is an explanatory partially cross-sectional view showing a bipolar electrostatic chuck X according to a tenth embodiment of the present invention.

FIG. 17 shows an explanatory partially cross-sectional view of a bipolar electrostatic chuck X according to a tenth embodiment of the present invention. In the bipolar electrostatic chuck X, a lower insulating layer 15 that is formed of a ceramic layer which is 100 mm in height×100 mm in width× 0.2 mm in sheet thickness is formed on a surface of a metal base 6 which is made of aluminum and is 100 mm in height× 100 mm in width×10 mm in thickness, by means of plasma thermal spray using alumina. Then, the upper surface of the ceramic layer that is formed by thermal spray is flattened through a machining process such that the surface roughness Ra becomes 10 μm.

Then, molybdenum is thermal-sprayed on the surface of the lower insulating layer 15 formed as described above to form a second electrode 64 that is 100 mm in height×100 mm in width×50 μm in film thickness. A metal to be used in this case is molybdenum as described above since it is necessary that the thermal expansion coefficient of the metal is set to be comparable with that of the ceramic material of the lower insulating layer 15 that has been formed by thermal spray as described above in order to suppress the thermal strain.

Further, an interelectrode insulating layer 13 that is 100 mm in height×100 mm in width×0.1 mm in thickness is formed on the surface of the second electrode 64 formed as described above by the same means as that of the lower insulating layer 15. After the surface of the interelectrode insulating layer 13 has been flattened as in the case of the lower insulating layer 15, given masking is conducted on the surface of the interelectrode insulating layer 13 so as to provide the band-like comb teeth of the same configuration as that of the first electrode 2 in the first embodiment, and molybdenum is thermal-sprayed on the surface of the interelectrode insulating layer 13 to form a first electrode 52 that is 50 μm in thickness. In formation of the first electrode 52, molybdenum is used so that the thermal expansion coefficient of the first electrode 52 is set to be comparable with that of the interelectrode insulating layer 13 as in the case of the second electrode 64. Then, alumina is thermal-sprayed onto the surface of the first electrode 52 in the same manner as that at the time of forming the lower insulating layer 15 and the interelectrode insulating layer 13, to thereby form an upper insulating layer 11 that is 100 mm in height×100 mm in width×0.1 mm in thickness. After the surface of the upper insulating layer 11 has been polished, the entire surface of the sprayed layer is vacuum-impregnated with epoxy or silicon in order to seal the surface, and a machining process is conducted in such a manner that the flatness of the entire surface, particularly, a portion that forms the sample attracting plane 7 becomes a reference value or within a deviation which is required in the manufacture process in a range of 5 to 20 μm in the surface roughness Ra. After that, an ultrasonic cleaning process is conducted on the product in an organic solvent and the electrostatic chuck X is completed. Note that a distance Y between the first electrode 52 and the second electrode 54 according to the tenth embodiment is 0.1 mm.

As described above, according to the electrostatic chuck with the insulating material, which has the first electrode, the second electrode, the interelectrode insulating layer, the upper insulating layer, and the lower insulating layer formed by ceramics spraying, even if the applied environments are severe such that particles frequently occur, the excellent performance in the resistance to the environments is exercised since the ceramics are high in abrasion resistance. Also, the above-mentioned electrostatic chuck is suitable for mass production since the electrostatic chuck can be relatively inexpensively manufactured.

Eleventh Embodiment

Figure 18:
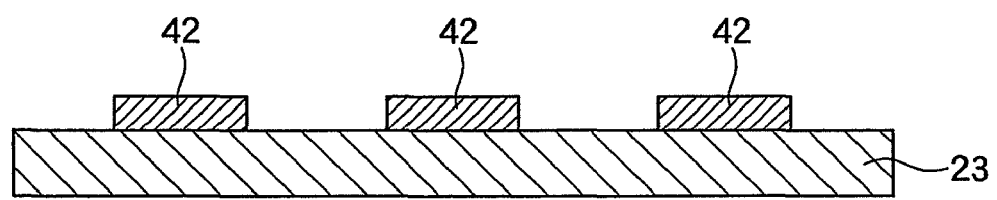
FIG. 18 is an explanatory partially cross-sectional view showing an interelectrode insulating layer and a first electrode of a bipolar electrostatic chuck X according to an eleventh embodiment of the present invention.

FIG. 18 shows an explanatory partially cross-sectional view of an interelectrode insulating layer 23 and a first electrode 62 in a bipolar electrostatic chuck X according to an eleventh embodiment of the present invention. A lower insulating layer 15 and a second electrode 64 are formed on a metal base 6 as in the tenth embodiment. Subsequently, a first electrode 62 is formed on an upper surface (sample attracting plane 7 side) of a ceramic thin film that is made of alumina and is 100 mm in height×100 mm in width×0.1 mm in thickness as an interelectrode insulating layer 23, as in the tenth embodiment.

Then, the interelectrode insulating layer 23 is laminated on the upper surface (the upper surface of the second electrode 64) of the metal base 6, the lower insulating layer 15, and the second electrode 64 which have been integrated together, and is fixed onto the upper surface with an epoxy adhesive agent. Then, the upper insulating layer 11 is formed on the surface of the first electrode 62 as in the tenth embodiment. The machining process and the supersonic cleaning process are conducted on the product in order to polish, seal, and flatten the surface of the upper insulating layer 11 as in the tenth embodiment, to thereby complete the electrostatic chuck X.

The interelectrode insulating layer that requires most the electrical insulation is formed of the ceramic thin sheet as in the electrostatic chuck X according to this embodiment, to thereby improve the reliability of the insulation between the electrodes, and to exercise the same electrical insulation as that in the case where the polyimide sheet is interposed between the electrodes in the present invention.

First Test Example

In the bipolar electrostatic chuck X according to the first embodiment and the third embodiment, a computation model is created for a two-dimensional electric field calculation, and an attracting performance (gradient force) per unit area is calculated through an energy variation method. A calculating condition is that a supply voltage is set to ±1500 V in both of the first and third embodiments. The results are shown in Table 1.

Figure 19:
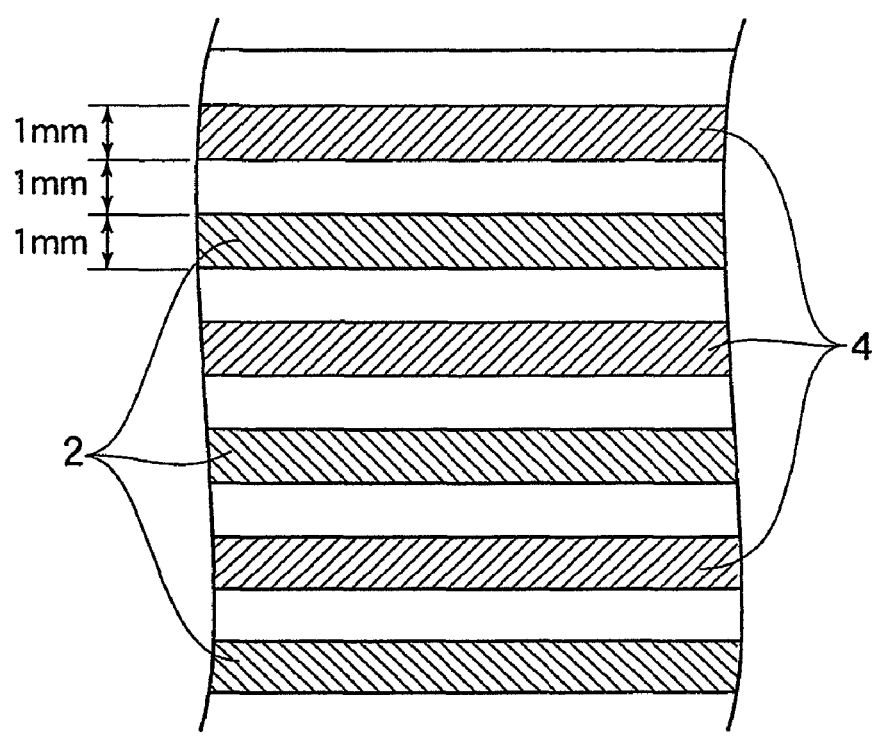
FIG. 19 is an explanatory plan view showing a first electrode and a second electrode in a first reference example.

Also, as a first reference example, there is created a computation model of a bipolar electrostatic chuck in which the first electrode 2 and the second electrode 4 which are formed in the band-like comb teeth are alternately arranged in one plane as shown in FIG. 19. In the first reference example, the first electrode 2 and the second electrode 4 are arranged to be adjacent to each other so that a pitch between the electrodes becomes 1 mm (the electrode width of the band-like portion in both of the first and second electrodes is 1 mm). Also, the first electrode 2 and the second electrode 4 are interposed between the upper insulating layer which is made of polyimide and the lower insulating layer which is made of polyimide, and potentials different in polarity are applied to the adjacent electrodes to provide the bipolar electrostatic chuck. The results are shown in Table 1.

TABLE 1

| | Attracting performance (gf/cm$^2$) | Capacitance (pF/cm$^2$) |
|---|---|---|
| First embodiment | 11.0 | 100 |
| Third embodiment | 11.0 | 650 |
| First reference example | 2.8 | 170 |

It is understood that the results of the first embodiment and the third embodiment are about four times as much as the attracting performance of the first reference example. Note that the value which is approximate to the result disclosed in the Non Patent Document 1 described above is calculated in the results of the first reference example, so it is presumed that the calculation results of the first test example is reliable also in other cases irrespective of the difference in samples (a glass substrate is used in the first reference example of the present invention, while a silicon wafer is used in the Non Patent Document 1).

Second Test Example

The capacitances of the bipolar electrostatic chucks X of the first embodiment, the third embodiment, and the first reference example are calculated through the same calculation as that of the first test example. It is presumed that the capacitance is in proportion to the residual attracting performance (the difficulty of dismounting the glass substrate 8 due to residual charges when the glass substrate 8 is removed from the sample attracting plane 7 after a voltage supply is stopped). The results are shown in Table 1. It is understood from the results that the structure in which the first electrode and the second electrode are not overlapped with each other when the sample attracting plane is viewed in the depth direction.

Third Test Example

Figure 20:
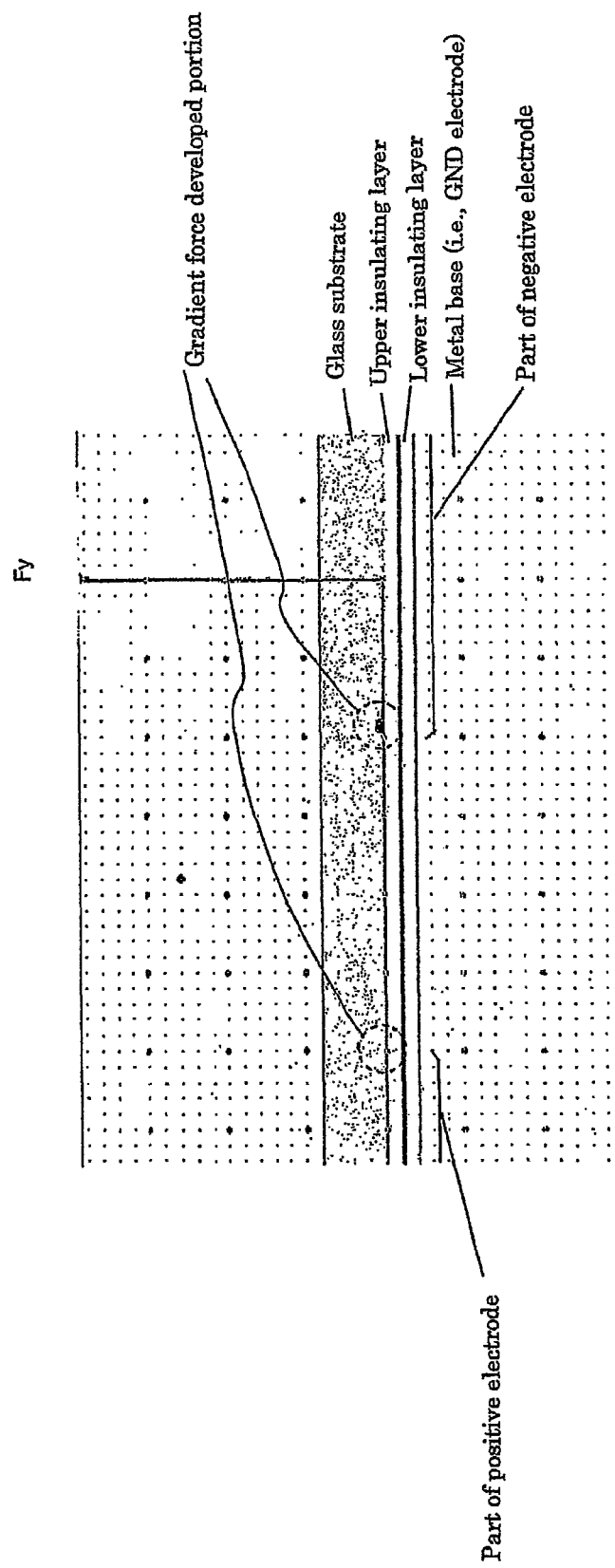
FIG. 20 shows the results of finding the distribution of a gradient force of the bipolar electrostatic chuck according to the first reference example by two-dimensional electric field calculation.
Figure 21:
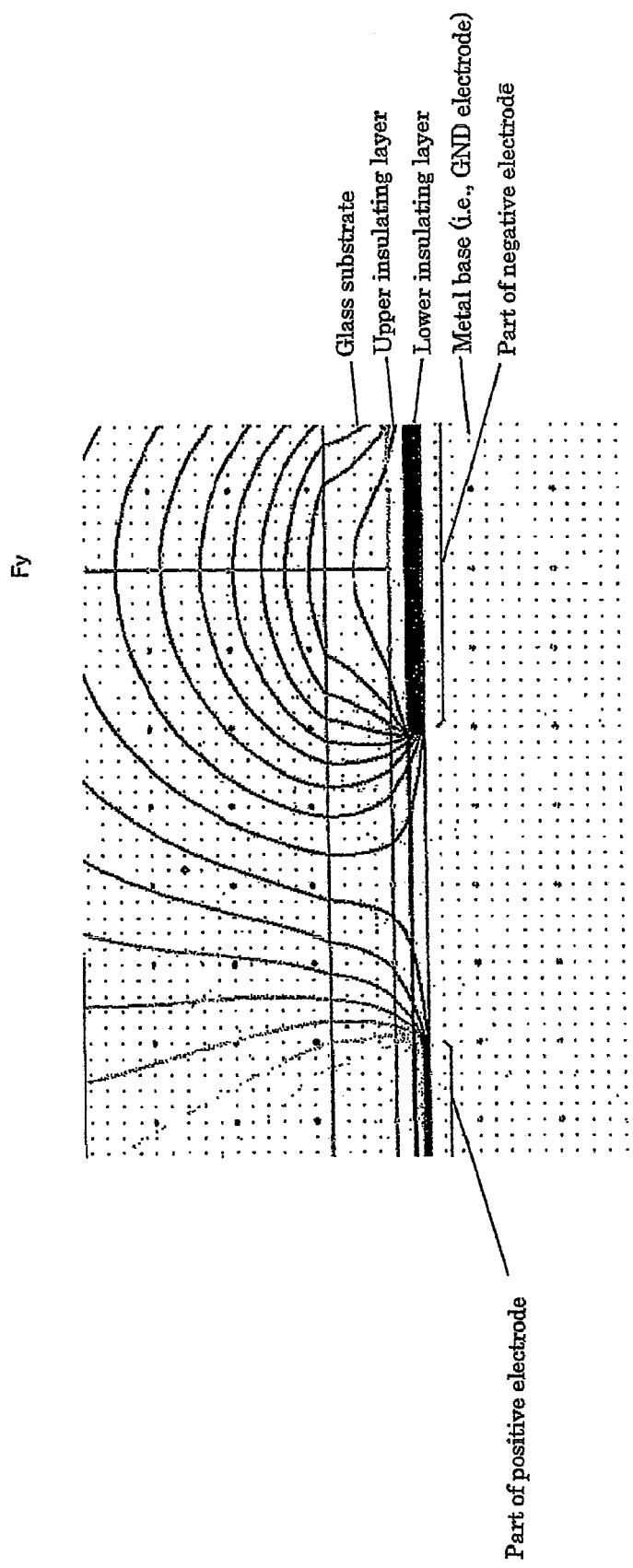
FIG. 21 shows the results of finding a distribution chart of a potential contour of the bipolar electrostatic chuck according to the first reference example by two-dimensional electric field calculation.
Figure 22:
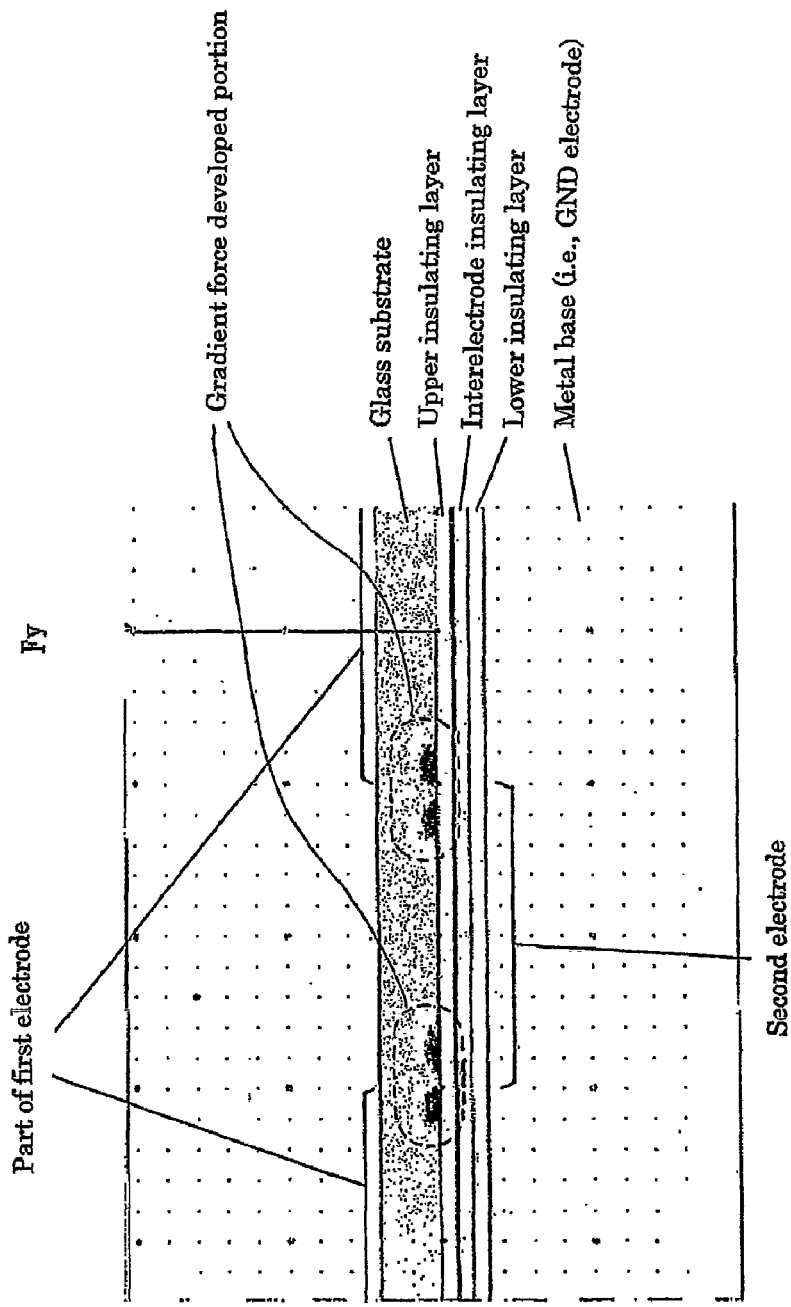
FIG. 22 shows the results of finding the distribution of a gradient force of the bipolar electrostatic chuck according to the first embodiment of the present invention by two-dimensional electric field calculation.
Figure 23:
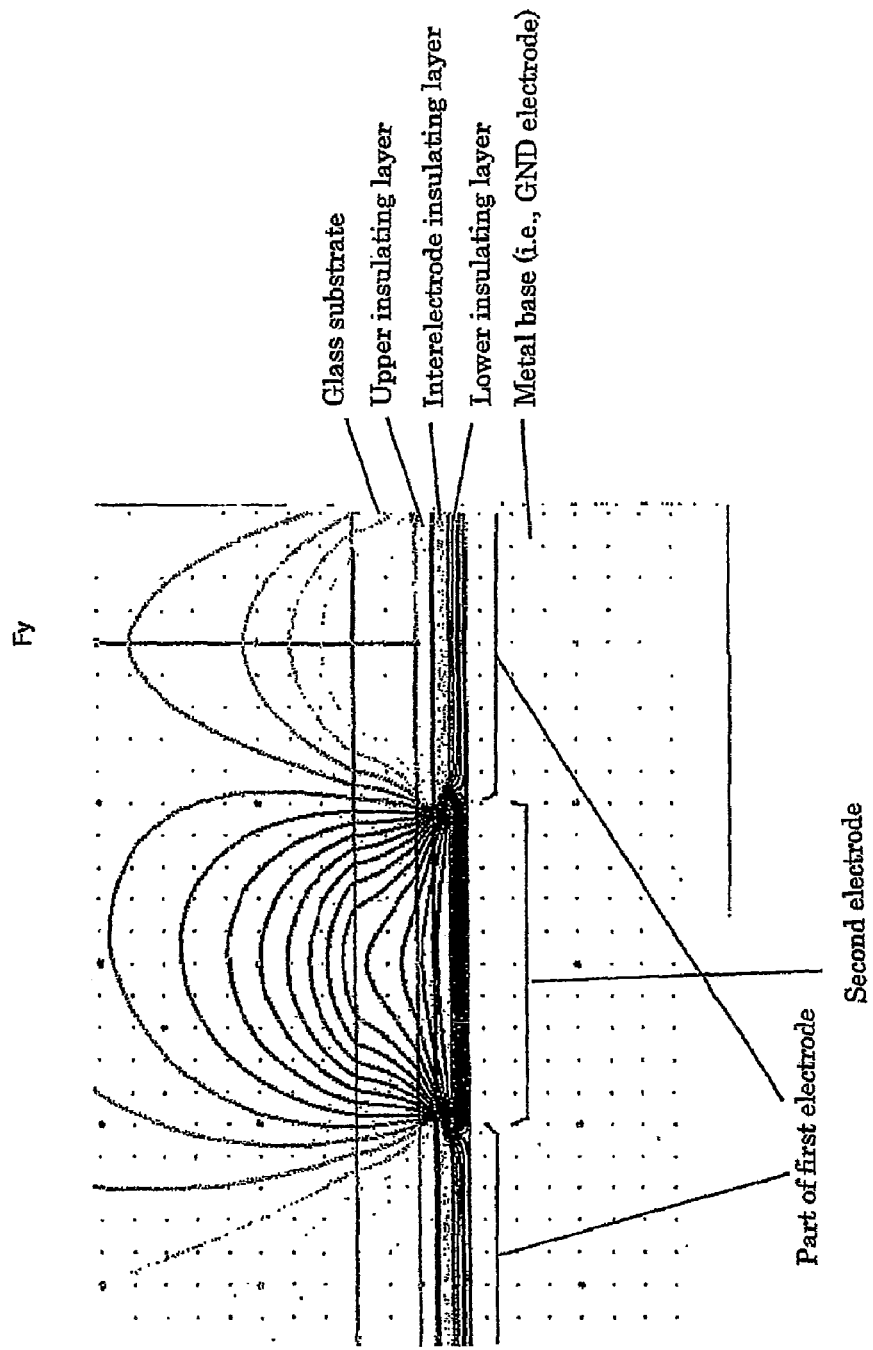
FIG. 23 shows the results of finding a distribution chart of a potential contour of the bipolar electrostatic chuck according to the first embodiment through two-dimensional electric field calculation.
Figure 24:
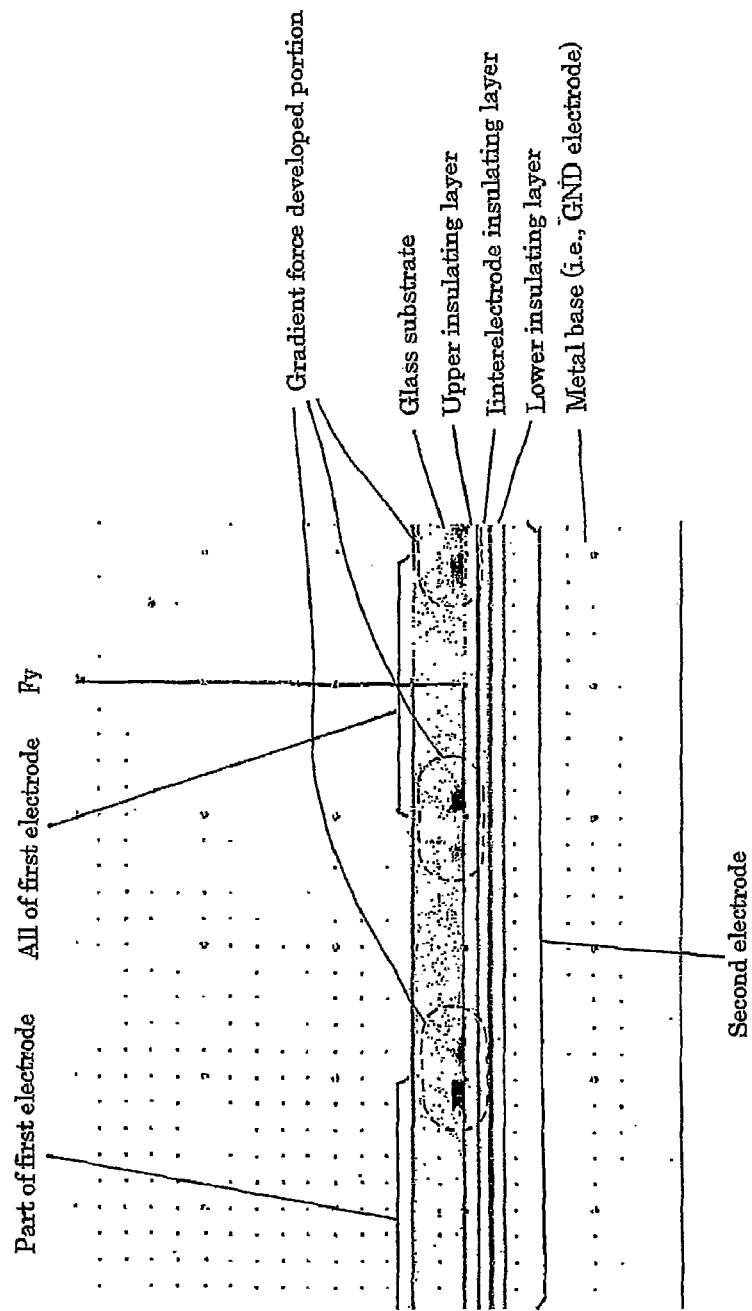
FIG. 24 shows the results of finding the distribution of a gradient force of the bipolar electrostatic chuck according to the third embodiment of the present invention by two-dimensional electric field calculation.
Figure 25:
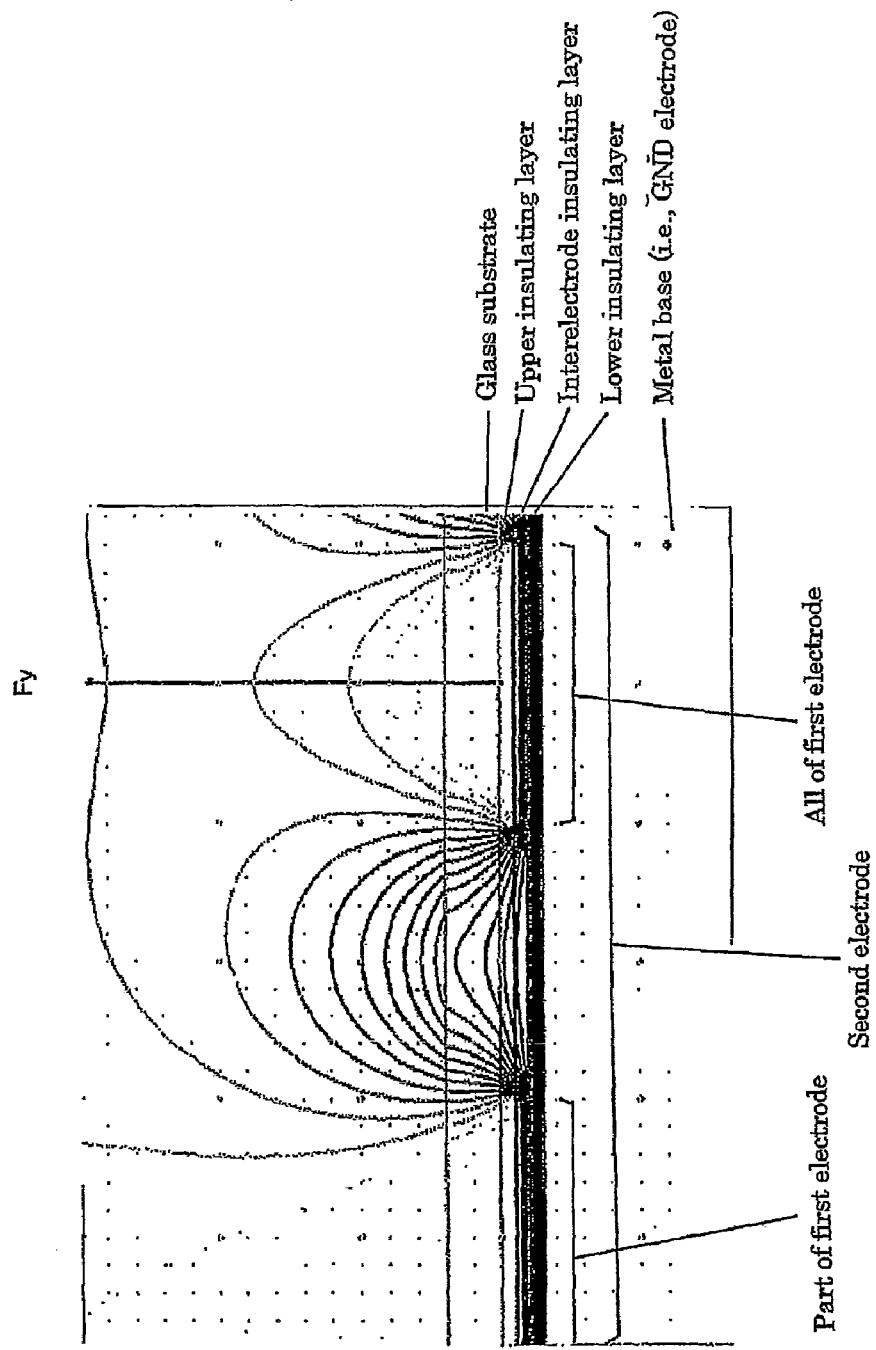
FIG. 25 shows the results of finding a distribution chart of a potential contour of the bipolar electrostatic chuck according to the third embodiment through two-dimensional electric field calculation.

Distribution charts of the gradient force and the potential contour of the first embodiment, the third embodiment, and the first reference example are calculated by creating calculation models in the two-dimensional electric field calculation. The results are shown in FIGS. 20 to 25 (FIGS. 20 and 21 shows the first reference example, FIGS. 22 and 23 show the first embodiment, and FIGS. 24 and 25 show the third embodiment). Note that in the respective drawings, the electrode portions of the respective models show enlarged views.

In this example, the gradient force Fy is represented with respect to the depth direction y of the sample attracting plane 7 by the following expression (2).

$$Fy=\partial(Ey^2)/\partial y \quad (2)$$

FIGS. 22 and 24 show that dark portions (portions high in the gradient force) widely exist in a region surrounded by dotted lines in those figures as compared with FIG. 20. As a result, it is understood that both of the electrostatic chucks of the first embodiment and the third embodiment have the excellent gradient force as compared with that of the first reference example. Note that it is found from FIGS. 23 and 25 that the gradient force exists in a portion where the potential contours are dense from sparse.

Fourth Test Example

Figure 26:
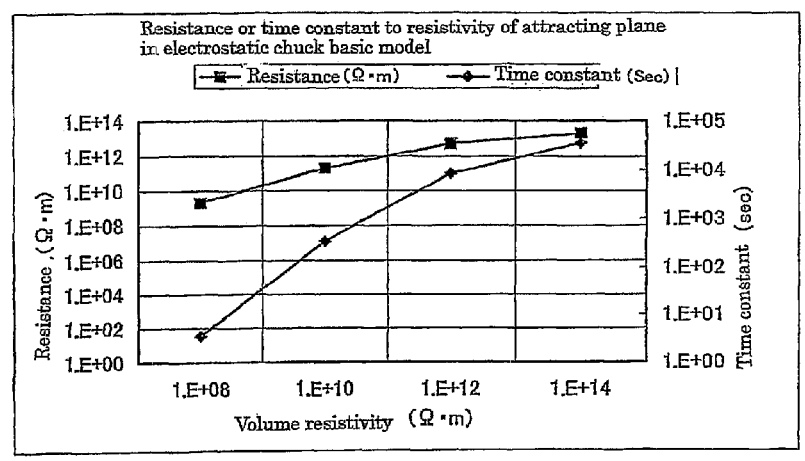
FIG. 26 is a graph showing a time constant in the case where the volume resistivity of the upper insulating layer is changed with the bipolar electrostatic chuck of the first reference example as a model.

With the bipolar electrostatic chuck of the first reference example as a model, a change in time constant in a case where a volume resistivity of the upper insulating layer is changed to assume the electrically conductive layer is graphed. The results are shown in FIG. 26. The time constant becomes smaller as the volume resistivity is further reduced from 1E14 $\Omega\cdot$m of polyimide. It is presumed that the time constant is reduced by three hold of magnitude when the volume resistivity is about 1E10 $\Omega\cdot$m, thereby contributing to easy dismounting of a substrate. This is because electric charges that have been stored in the glass substrate flow into the electrode through the electrically conductive layer, and are finally removed naturally in a power source or removed by an external discharge unit or the like.

Fifth Test Example

Figure 27:
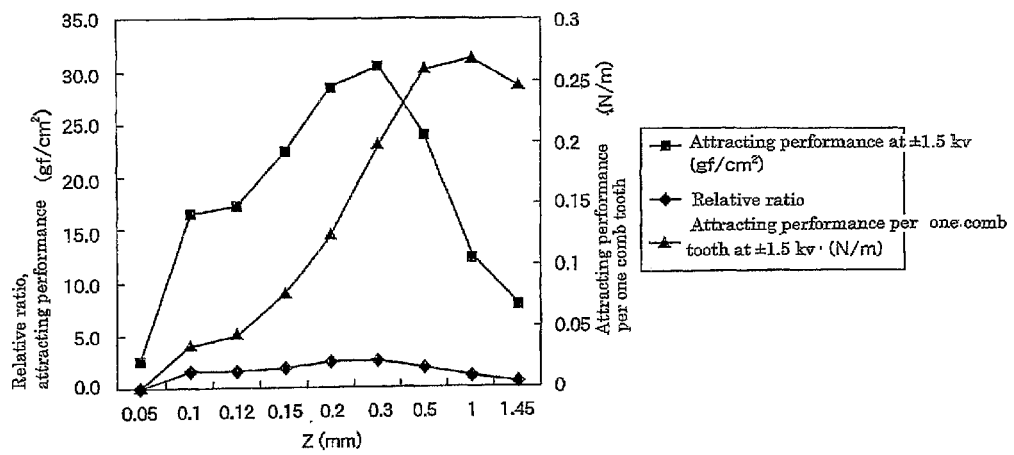
FIG. 27 is a graph showing the optimization of a band-like electrode width, i.e., gap between the electrodes, of an attracting performance.
Figure 28:
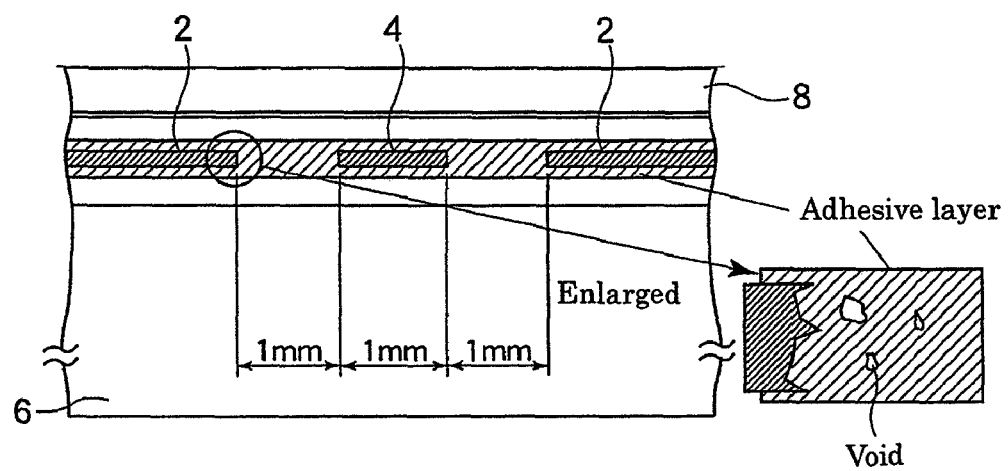
FIG. 28 is an explanatory cross-sectional view showing a conventional bipolar electrostatic chuck.

It is assumed to model the bipolar electrostatic chuck that has the first electrode 2 shaped in the band-like comb teeth and the second electrode 4 shaped in the band-like comb teeth as in the first embodiment, and has the upper insulating layer 1, the interelectrode insulating layer 3, and the lower insulating layer 5 formed of the polyimide films which are 50 μm in film thickness, respectively, as in the first embodiment. In this case, a width z (band-like electrode width z) of the band-like portion 2a in the first electrode 2 is made equal to an interval z (interelectrode gap z) between the adjacent band-like portions 2a, and a width z (band-like electrode width z) of the band-like portion 4a in the second electrode 4 is made equal to an interval z (interelectrode gap z) between the adjacent band-like portions 4a. Then, the attracting performance (gf/cm2) per unit area on the sample attracting plane is calculated by changing the value z (=band-like electrode width=interelectrode gap). The results are shown in FIG. 27. FIG. 27 graphs a change in respective values of a relative ratio of the attracting performance indicative of the ratio of the attracting performance in a case where z=1 mm is set as 1 [an axis on the left side of the graph], an attracting performance (gf/cm$^2$) in a case where a potential of $\pm$1.5 kV is applied [an axis on the left side of the graph], and an attracting performance (N/m) per unit length which is exerted on one tooth (band-like portion 2a) of the band-like comb teeth that constitute the first electrode 2 in the case where a potential of $\pm$1.5 kV is applied (an axis on the right side of the graph). In the graph, when z is in a range from 0.15 to 0.5 mm, the relative ratio and the attracting performance (gf/cm$^2$) in the case where the potential of $\pm$1.5 kV is applied become maximum, and reach the maximum points when z is about 0.3 mm, respectively. As is apparent from the above results, it is found that the attracting performance of 30 gf/cm$^2$ at the maximum is obtained in the case where the potential of $\pm$1.5 kV is applied. The value exceeds 10 times as much as the attracting performance of the first reference example in the first test example.

In a case in which the film thickness of the polyimide film that constitutes the interelectrode insulating layer 3 is set to 25 μm, and another case in which the film thickness is set to 75 μm, an attracting performance (gf/cm$^2$) per unit area on the sample attracting plane is calculated by changing the value z (=band-like electrode width=interelectrode gap), under the same conditions as those described above except for the thickness of the polyimide film. As a result, the attracting performance becomes the maximum in each of the film thicknesses when z is in the range of 0.15 to 0.5 mm, and reaches the maximum point when z is about 0.3 mm as in the above results. It is found that in the case where the film thickness of the interelectrode insulating layer is 25 μm, the maximum attracting performance indicates a value of 46 gf/cm$^2$ when a potential of $\pm$1.5 kV is applied, and the attracting performance increases as the film thickness of the interelectrode insulating layer becomes thinner.

It should be noted that in the contents of the fifth test example, the same results are obtained even in the case where the second electrode is formed in a plane having a given planar area. In other words, in the model of the bipolar electrostatic chuck having the first electrode 2 of the band-like comb teeth and the plate-like second electrode 24 having the given planar area as in the third embodiment, it is found that the same results as those indicated by the graph of FIG. 27 are obtained even if calculation is conducted under the conditions of the above fifth test example.

INDUSTRIAL APPLICABILITY

The bipolar electrostatic chuck according to the present invention is excellent in electric field intensity and exercises the high gradient force, thereby making it possible to provide the excellent flatness of the sample that is attracted and held. Also, the bipolar electrostatic chuck according to the present invention exercises the sufficient attracting performance even in a large size sample. In particular, a glass substrate for a liquid crystal display which is called "fourth generation" in recent years is 900 mm×1100 mm in size, and in order to realize the electrostatic chuck that attracts the glass substrate, the electrostatic chuck of the present invention which is, for example, 300 mm×400 mm in size is fabricated, and 9 electrostatic chucks are disposed on a device table which is capable of evenly assembling those electrostatic chucks, thereby making it possible to realize the above electrostatic chuck.

Also, the bipolar electrostatic chuck according to the present invention exercises not only the attracting performance caused by the gradient force, but also a coulomb force having the attracting performance of, for example, about 100 gf/cm$^2$, in addition to the gradient force. As a result, the bipolar electrostatic chuck according to the present invention can be used to attract and hold the semiconductor substrate such as a silicon wafer. In other words, the use of the bipolar electrostatic chuck according to the present invention makes it possible to process the insulating substrate such as the glass substrate and the semiconductor substrate such as the silicon wafer by the same device. In either case, the bipolar electrostatic chuck according to the present invention is capable of attracting and holding those substrates with high reliability under the optimized conditions where a voltage that is applied to the electrodes is lowered as much as possible.

Also, the bipolar electrostatic chuck according to the present invention is capable of eliminating the difficulty of dismounting the sample from the sample attracting plane as much as possible after the voltage has been applied to the electrodes. For that reason, the present invention is valuable particularly in the fields of the liquid crystal panel and the semiconductor manufacturing which are increasingly upsized in recent years, as well as the manufacturing field of diverse flat panel displays, and the field and the like which is related to a manufacturing process of a semiconductor substrate made of silicon, amorphous silicon, gallium phosphide, gallium arsenide, silicon-on-insulator, or the like, a glass substrate made of soda lime glass, low-alkali glass, non-alkali glass, or the like, a resin film substrate for flexible display which may be realizable in near future, or the like.

The invention claimed is:

1. A method to attract a substrate comprising steps of:
providing a bipolar electrostatic chuck comprises:
   a first electrode;
   a second electrode; and
   an insulating material comprising an upper insulating layer, an inter-electrode insulating layer, and a lower insulating layer, wherein
   the upper insulating layer, the first electrode, the inter-electrode insulating layer, the second electrode, and the lower insulating layer are positioned in the order of distance from a substrate attracting plane,
   the first electrode is formed in a comb-like configuration, and
   when the insulating material is viewed from a side cross-sectional view, the first electrode has a plurality of gaps, and the second electrode has a plurality of areas that are not overlapped with the first electrode; and
applying voltage between the first electrode and second electrode, so as to generate electric lines of force which extend from the first electrode to the second electrode, though the gaps of the first electrode and reaching the substrate attracting plane, wherein the first and second electrodes are positioned in different horizontal planes, when said bipolar electrostatic chuck is viewed from a side cross sectional view, said electric lines of force generate a gradient force whereby the substrate is attracted to a surface of the insulating material as the substrate attracting plane, wherein
the second electrode is formed in a plane having a given planar area,
a part of the second electrode is overlapped with the first electrode in a normal line direction of the substrate attracting plane,
a electrode width (z) of the first electrode and an inter-electrode gap (z) of the first electrode are made equal to each other, (z) is in a range of 0.15 to 0.5 mm, and
the inter-electrode insulating layer has a thickness of 1 to 1000 μm.

2. A method to attract a substrate comprising steps of:
providing a bipolar electrostatic chuck comprises:
   a first electrode;
   a second electrode; and
   an insulating material comprising an upper insulating layer, an inter-electrode insulating layer, and a lower insulating layer, wherein
   the upper insulating layer, the first electrode, the inter-electrode insulating layer, the second electrode, and the lower insulating layer are positioned in the order of distance from a substrate attracting plane,
   the first electrode is formed in a mesh configuration having a plurality of openings each within a given area,
   the second electrode is formed in a plane having a given planar area, wherein a part of the second electrode is overlapped with the first electrode in a normal line direction of the substrate attracting plane, and
   when the insulating material is viewed from a side cross-sectional view, the first electrode has a plurality of gaps, and the second electrode has a plurality of areas that are not overlapped with the first electrode; and
applying voltage between the first electrode and second electrode, so as to generate electric lines of force which extend from the first electrode to the second electrode, though the gaps of the first electrode and reaching the substrate attracting plane, wherein the first and second electrodes are positioned in different horizontal planes, when said bipolar electrostatic chuck is viewed from a side cross sectional view, said electric lines of force generate a gradient force whereby the substrate is attracted to a surface of the insulating material as the substrate attracting plane, wherein
a size of each of the openings of the first electrode is in a range of 0.1 to 3.0 mm, and
the inter-electrode insulating layer has a thickness of 1 to 1000 μm.

3. The method of claim 1 or 2, wherein the insulating substrate is a glass substrate.

4. The method of claim 1 or 2, wherein a distance between the first electrode and the second electrode is equal to or more than 1 μm and equal to or less than 1000 μm.

5. The method of claim 1 or 2, wherein the inter-electrode insulating layer is formed of a resin layer made of one or more resins selected from the group consisting of polyimide, polyamide-imide, polyester, polyethylene terephthalate, epoxy, and acryl.

6. The method of claim 5, wherein the resin layer is formed of one or more resin films.

7. The method of claim 1 or 2, wherein the inter-electrode insulating layer is formed of a ceramic layer made of one or more elements selected from the group consisting of aluminum oxide, aluminum nitride, silicon carbide, silicon nitride, zirconia, and titania.

8. The method of claim 1 or 2, wherein the inter-electrode insulating layer is formed of one or two elements selected from the group consisting of silicon and silicon dioxide.

9. The method of claim 1 or 2, wherein
an electrically conductive layer is further formed on the surface of the insulating material, and
the surface of the electrically conductive layer serves as the substrate attracting plane.

10. The method of claim 1 or 2, wherein the upper insulating layer has a thickness of 10 to 200 μm.

* * * * *